(12) United States Patent
Lee

(10) Patent No.: US 11,056,496 B2
(45) Date of Patent: Jul. 6, 2021

(54) SEMICONDUCTOR MEMORY DEVICE AND METHOD FOR PROGRAMMING SHARED PAGE DATA IN MEMORY CELLS OF TWO DIFFERENT WORD LINES

(71) Applicant: SK hynix Inc., Gyeonggi-do (KR)

(72) Inventor: Hee Youl Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/229,216

(22) Filed: Dec. 21, 2018

(65) Prior Publication Data
US 2019/0363099 A1    Nov. 28, 2019

(30) Foreign Application Priority Data
May 24, 2018   (KR) .................. 10-2018-0059291

(51) Int. Cl.
| | | |
|---|---|---|
| *G11C 16/04* | (2006.01) | |
| *G11C 16/10* | (2006.01) | |
| *H01L 27/11556* | (2017.01) | |
| *H01L 27/11529* | (2017.01) | |
| *H01L 27/11582* | (2017.01) | |
| *H01L 27/1157* | (2017.01) | |

(52) U.S. Cl.
CPC .... *H01L 27/11556* (2013.01); *G11C 16/0408* (2013.01); *G11C 16/0466* (2013.01); *G11C 16/10* (2013.01); *H01L 27/1157* (2013.01); *H01L 27/11529* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 9,229,848 B2 | 1/2016 | Parthasarathy et al. | |
| 2004/0080979 A1* | 4/2004 | Park | G11C 11/5628 365/185.03 |
| 2007/0274128 A1* | 11/2007 | Kamei | G11C 11/5628 365/185.03 |
| 2008/0112221 A1* | 5/2008 | Park | G11C 11/5628 365/185.03 |
| 2009/0109747 A1* | 4/2009 | Radke | G11C 11/5621 365/185.03 |
| 2012/0307559 A1* | 12/2012 | Shen | G11C 16/0483 365/185.03 |

(Continued)

FOREIGN PATENT DOCUMENTS

| | | |
|---|---|---|
| KR | 101504083 | 3/2015 |
| KR | 102016009055 | 7/2016 |

*Primary Examiner* — J. H. Hur
(74) *Attorney, Agent, or Firm* — IP & T Group LLP

(57) ABSTRACT

A semiconductor memory device includes a memory cell array, a peripheral circuit, and a control logic. The memory cell array may include a plurality of memory cells. The peripheral circuit may program shared page data on selected memory cells among the plurality of memory cells. The control logic may control, during the program operation on the selected memory cells, the peripheral circuit to program first partial data of the shared page data to memory cells coupled to a first word line among the selected memory cells, and to program second partial data of the shared page data to memory cells coupled to a second word line different from the first word line among the selected memory cells.

10 Claims, 17 Drawing Sheets

| MSB1 | 1 | 1 | 1 | 1 | 0 | 0 | 0 | 0 |
|---|---|---|---|---|---|---|---|---|
| CSB1 | 1 | 1 | 0 | 0 | 0 | 0 | 1 | 1 |
| LSB | 1 | 0 | 0 | 1 | 1 | 0 | 0 | 1 |

| MSB1 | 1 | 1 | 1 | 1 | 0 | 0 | 0 | 0 |
|---|---|---|---|---|---|---|---|---|
| CSB1 | 1 | 1 | 0 | 0 | 0 | 0 | 1 | 1 |
| LSB | X | X | X | X | 1 | 0 | 0 | 1 |
| STATE | E | P1 | P2 | P3 | P4 | P5 | | |

(56) References Cited

U.S. PATENT DOCUMENTS

| | | | |
|---|---|---|---|
| 2013/0272071 A1* | 10/2013 | Moschiano | G11C 11/5628 365/185.24 |
| 2014/0119089 A1* | 5/2014 | Meir | G11C 16/12 365/45 |
| 2014/0153332 A1* | 6/2014 | Parthasarathy | G11C 16/26 365/185.09 |
| 2014/0208054 A1* | 7/2014 | Parthasarathy | G11C 11/5628 711/165 |

* cited by examiner

FIG. 7A

| MSB1 | 1 | 1 | 1 | 1 | 0 | 0 | 0 | 0 |
|---|---|---|---|---|---|---|---|---|
| CSB1 | 1 | 1 | 0 | 0 | 0 | 0 | 1 | 1 |
| LSB | 1 | 0 | 0 | 1 | 1 | 0 | 0 | 1 |

FIG. 7B

| MSB1 | 1 | 1 | 1 | 1 | 0 | 0 | 0 | 0 |
|---|---|---|---|---|---|---|---|---|
| CSB1 | 1 | 1 | 0 | 0 | 0 | 0 | 1 | 1 |
| LSB | X | X | X | X | 1 | 0 | 0 | 1 |
| STATE | E | | P1 | | P2 | P3 | P4 | P5 |

FIG. 8A

| MSB2 | 1 | 1 | 1 | 1 | 0 | 0 | 0 | 0 |
|---|---|---|---|---|---|---|---|---|
| CSB2 | 1 | 1 | 0 | 0 | 0 | 0 | 1 | 1 |
| LSB | 1 | 0 | 0 | 1 | 1 | 0 | 0 | 1 |

FIG. 8B

| MSB2 | 1 | 1 | 1 | 1 | 0 | 0 | 0 | 0 |
|---|---|---|---|---|---|---|---|---|
| CSB2 | 1 | 1 | 0 | 0 | 0 | 0 | 1 | 1 |
| LSB | 1 | 0 | 0 | 1 | X | X | X | X |
| STATE | E | P1 | P2 | P3 | P4 | | P5 | |

| MSB1 | 1 | 1 | 1 | 1 | 1 | 1 | 0 | 0 | 0 | 0 | 0 | 0 | 0 | 0 | 1 | 1 |
|------|---|---|---|---|---|---|---|---|---|---|---|---|---|---|---|---|
| HCSB1 | 1 | 1 | 0 | 0 | 0 | 0 | 0 | 0 | 0 | 0 | 1 | 1 | 1 | 1 | 1 | 1 |
| LCSB1 | 1 | 1 | 1 | 1 | 0 | 0 | 0 | 0 | 1 | 1 | 1 | 1 | 0 | 0 | 0 | 0 |
| LSB | 1 | 0 | 0 | 1 | 1 | 0 | 0 | 1 | 1 | 0 | 0 | 1 | 1 | 0 | 0 | 1 |

| MSB1 | 1 | 1 | 1 | 1 | 1 | 1 | 0 | 0 | 0 | 0 | 0 | 0 | 0 | 0 | 1 | 1 |
|------|---|---|---|---|---|---|---|---|---|---|---|---|---|---|---|---|
| HCSB1 | 1 | 1 | 0 | 0 | 0 | 0 | 0 | 0 | 0 | 0 | 1 | 1 | 1 | 1 | 1 | 1 |
| LCSB1 | 1 | 1 | 1 | 1 | 0 | 0 | 0 | 0 | 1 | 1 | 1 | 1 | 0 | 0 | 0 | 0 |
| LSB | X | X | X | X | X | X | X | X | 1 | 0 | 0 | 1 | 1 | 0 | 0 | 1 |
| STATE | E | | P1 | | P2 | | P3 | | P4 | P5 | P6 | P7 | P8 | P9 | P10 | P11 |

FIG. 13A

| MSB2 | 1 | 1 | 1 | 1 | 1 | 1 | 0 | 0 | 0 | 0 | 0 | 0 | 0 | 0 | 1 | 1 |
|---|---|---|---|---|---|---|---|---|---|---|---|---|---|---|---|---|
| HCSB2 | 1 | 1 | 0 | 0 | 0 | 0 | 0 | 0 | 0 | 0 | 1 | 1 | 1 | 1 | 1 | 1 |
| LCSB2 | 1 | 1 | 1 | 1 | 0 | 0 | 0 | 0 | 1 | 1 | 1 | 1 | 0 | 0 | 0 | 0 |
| LSB | 1 | 0 | 0 | 1 | 1 | 0 | 0 | 1 | 1 | 0 | 0 | 1 | 1 | 0 | 0 | 1 |

FIG. 13B

| MSB2 | 1 | 1 | 1 | 1 | 1 | 1 | 0 | 0 | 0 | 0 | 0 | 0 | 0 | 0 | 1 | 1 |
|---|---|---|---|---|---|---|---|---|---|---|---|---|---|---|---|---|
| HCSB2 | 1 | 1 | 0 | 0 | 0 | 0 | 0 | 0 | 0 | 0 | 1 | 1 | 1 | 1 | 1 | 1 |
| LCSB2 | 1 | 1 | 1 | 1 | 0 | 0 | 0 | 0 | 1 | 1 | 1 | 1 | 0 | 0 | 0 | 0 |
| LSB | 1 | 0 | 0 | 1 | 1 | 0 | 0 | 1 | X | X | X | X | X | X | X | X |
| STATE | E | P1 | P2 | P3 | P4 | P5 | P6 | P7 | P8 | | P9 | | P10 | | P11 | |

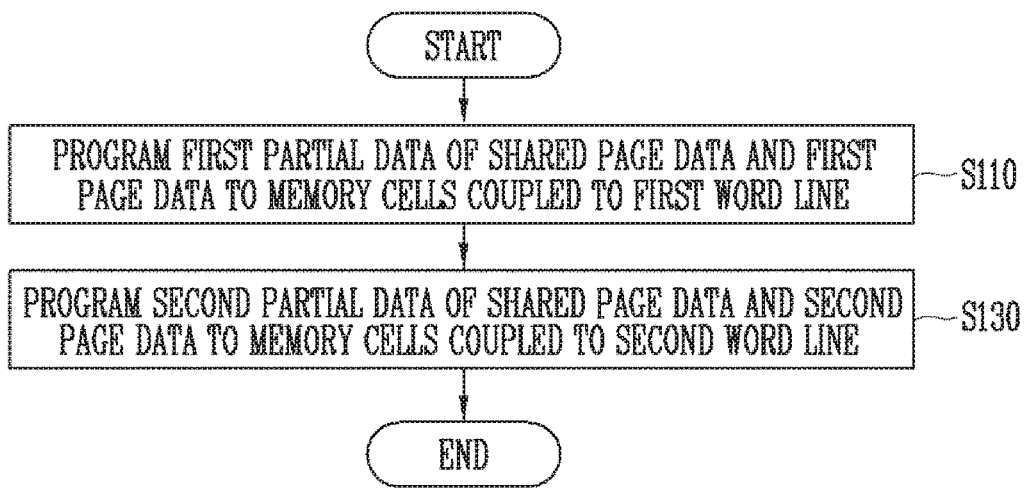
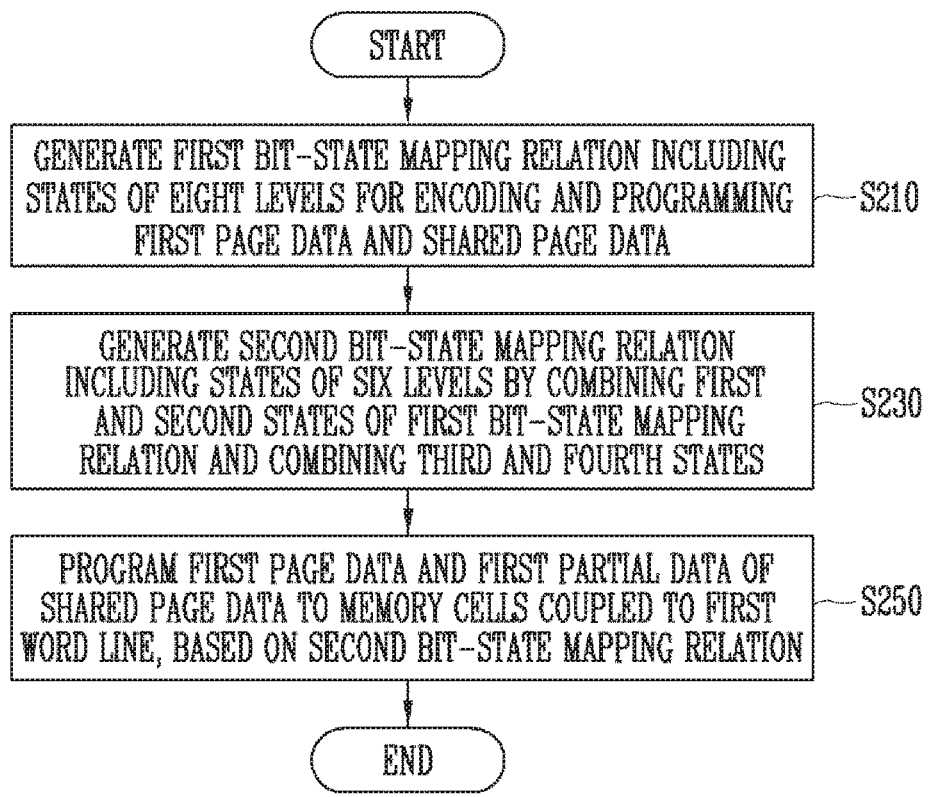

SEMICONDUCTOR MEMORY DEVICE AND METHOD FOR PROGRAMMING SHARED PAGE DATA IN MEMORY CELLS OF TWO DIFFERENT WORD LINES

CROSS-REFERENCE TO RELATED APPLICATION

The present application claims priority under 35 U.S.C. § 119(a) to Korean patent application number 10-2018-0059291, filed on May 24, 2018, which is incorporated herein by reference in its entirety.

BACKGROUND

Field of Invention

Various embodiments of the present disclosure generally relate to an electronic device, and more particularly, to a semiconductor memory device and a method of operating the semiconductor memory device.

Description of Related Art

Generally, a memory device may have a two-dimensional structure in which strings are horizontally arranged on a semiconductor substrate, or a three-dimensional structure in which strings are vertically stacked on a semiconductor substrate. The three-dimensional memory device may be a device which is devised to overcome a limitation in the degree of integration of the two-dimensional memory device, and may include a plurality of memory cells which are vertically stacked on a semiconductor substrate.

SUMMARY

Various embodiments of the present disclosure are directed to a semiconductor memory device capable of enhancing the degree of data integration.

Various embodiments of the present disclosure are directed to a method of operating a semiconductor memory device capable of enhancing the degree of data integration.

An embodiment of the present disclosure may provide for a semiconductor memory device including a memory cell array, a peripheral circuit, and a control logic. The memory cell array may include a plurality of memory cells. The peripheral circuit may program shared page data on selected memory cells among the plurality of memory cells. The control logic may control, during the program operation on the selected memory cells, the peripheral circuit to program first partial data of the shared page data to memory cells coupled to a first word line among the selected memory cells, and to program second partial data of the shared page data to memory cells coupled to a second word line different from the first word line among the selected memory cells.

In an embodiment, the control logic may control the peripheral circuit to generate a first bit-state mapping relation for first page data and the shared page data; to generate a second bit-state mapping relation by combining states included in a first group among states included in the first bit-state mapping relation with each other; and to program the first page data and the first partial data based on the second bit-state mapping relation.

In an embodiment, the control logic may control the peripheral circuit to generate the first bit-state mapping relation for second page data and the shared page data; to generate a third bit-state mapping relation by combining states included in a second group among the states included in the first bit-state mapping relation are combined with each other; and to program the second page data and the second partial data based on the third bit-state mapping relation.

In an embodiment, the first page data may include first most significant bit (MSB) page data and first central significant bit (CSB) page data. The second page data may include second MSB page data and second CSB page data. The shared page data may be least significant bit (LSB) page data. The memory cells coupled to the first word line and the memory cells coupled to the second word line may store a total of five bits together.

In an embodiment, the first bit-state mapping relation may include states of eight levels, the first group may include a first state, a second state, a third state, and a fourth state, and the second group may include a fifth state, a sixth state, a seventh state, and an eighth state. The second bit-state mapping relation may be generated by combining the first and the second states with each other and combining the third and the fourth states with each other. The third bit-state mapping relation may be generated by combining the fifth and the sixth states with each other and combining the seventh and the eighth states with each other.

In an embodiment, the first page data may include first most significant bit (MSB) page data, first higher-central significant bit (HCSB) page data, and first lower-central significant bit (LCSB) page data. The second page data may include second MSB page data, second HCSB page data, and second LCSB page data. The shared page data may be least significant bit (LSB) page data. The memory cells coupled to the first word line and the memory cells coupled to the second word line may store a total of seven bits together.

In an embodiment, the first bit-state mapping relation may include states of sixteen levels, the first group may include first to eighth states, and the second group may include ninth to sixteenth states. The second bit-state mapping relation may be generated by combining the first and the second states of the first bit-state mapping relation with each other, combining the third and the fourth states with each other, combining the fifth and the sixth states with each other, and combining the seventh and the eighth states with each other. The third bit-state mapping relation may be generated by combining the ninth and the tenth states of the first bit-state mapping relation with each other, combining the eleventh and the twelfth states with each other, combining the thirteenth and the fourteenth states with each other, and combining the fifteenth and the sixteenth states with each other.

An embodiment of the present disclosure may provide for a method of operating a semiconductor memory device for programming selected memory cells of a plurality of memory cells. The method may include: programming first partial data of shared page data, and first page data to memory cells coupled to a first word line among the selected memory cells; and programming second partial data of the shared page data, and second page data to memory cells coupled to a second word line different from the first word line among the selected memory cells.

In an embodiment, the programming of the first partial data and the first page data may include: generating a first bit-state mapping relation for the first page data and the shared page data; generating a second bit-state mapping relation by combining states included in a first group among states included in the first bit-state mapping relation with each other; and programming the first page data and the first partial data to the memory cells coupled to the first word line, based on the second bit-state mapping relation.

In an embodiment, the programming of the second partial data and the second page data may include: generating the first bit-state mapping relation for the second page data and the shared page data; generating a third bit-state mapping relation by combining states included in a second group among the states included in the first bit-state mapping relation with each other; and programming the second page data and the second partial data to the memory cells coupled to the second word line, based on the third bit-state mapping relation.

In an embodiment, the first page data may include first most significant bit (MSB) page data and first central significant bit (CSB) page data. The second page data may include second MSB page data and second CSB page data. The shared page data may be least significant bit (LSB) page data. The memory cells coupled to the first word line and the memory cells coupled to the second word line may store a total of five bits together.

In an embodiment, the first bit-state mapping relation for the first page data and the shared page data may include states of eight levels each corresponding to data of three bits respectively included in the first MSB page data, the first CSB page data, and the LSB page data. The first bit-state mapping relation for the second page data and the shared page data may include states of eight levels each corresponding to data of three bits respectively included in the second MSB page data, the second CSB page data, and the LSB page data.

In an embodiment, the first group may include a first state, a second state, a third state, and a fourth state, and the second group may include a fifth state, a sixth state, a seventh state, and an eighth state. The generating of the second bit-state mapping relation may include generating the second bit-state mapping relation by combining the first and the second states with each other and combining the third and the fourth states with each other. The generating of the third bit-state mapping relation may include generating the third bit-state mapping relation by combining the fifth and the sixth states with each other and combining the seventh and the eighth states with each other.

In an embodiment, the first page data may include first most significant bit (MSB) page data, first higher-central significant bit (HCSB) page data, and first lower-central significant bit (LCSB) page data. The second page data may include second MSB page data, second HCSB page data, and second LCSB page data. The shared page data may be least significant bit (LSB) page data. The memory cells coupled to the first word line and the memory cells coupled to the second word line may store a total of seven bits together.

In an embodiment, the first bit-state mapping relation for the first page data and the shared page data may include states of sixteen levels each corresponding to data of four bits respectively included in the first MSB page data, the first HCSB page data, the first LCSB page data, and the LSB page data. The first bit-state mapping relation for the second page data and the shared page data may include states of sixteen levels each corresponding to data of four bits respectively included in the second MSB page data, the second HCSB page data, the second LCSB page data, and the LSB page data.

In an embodiment, the first group may include first to eighth states, and the second group may include ninth to sixteenth states. The generation of the second bit-state mapping relation may include generating the second bit-state mapping relation by combining the first and the second states of the first bit-state mapping relation with each other, combining the third and the fourth states with each other, combining the fifth and the sixth states with each other, and combining the seventh and the eighth states. The generating of the third bit-state mapping relation may include generating the third bit-state mapping relation by combining the ninth and the tenth states of the first bit-state mapping relation with each other, combining the eleventh and the twelfth states with each other, combining the thirteenth and the fourteenth states with each other, and combining the fifteenth and the sixteenth states with each other.

An embodiment of the present disclosure may provide for a method of operating a semiconductor memory device configured to store first partial data of shared page data and first page data in memory cells coupled to a first word line, and store second partial data of the shared page data and second page data in memory cells coupled to a second word line different from the first word line. The method may include: applying a reference voltage to the first word line coupled to a first memory cell; and reading the shared page data from any one of the first memory cell and a second memory cell coupled to the second word line, based on whether the first memory cell is turned on.

In an embodiment, the reading of the shared page data may include reading, when the first memory cell is turned on, data from the first memory cell using read voltages lower than the reference voltage.

In an embodiment, the reading of the shared page data may include reading, when the first memory cell is turned off, data from the second memory cell using read voltages higher than the reference voltage.

BRIEF DESCRIPTION OF THE DRAWINGS

FIG. 7A is a diagram illustrating a first bit-state mapping relation for encoding data to be programmed to a first word line among the page data shown in FIG. 6.

FIG. 7B is a diagram illustrating a second bit-state mapping relation deduced from the first bit-state mapping relation of FIG. 7A.

FIG. 8A is a diagram illustrating a first bit-state mapping relation for encoding data to be programmed to a second word line among the page data shown in FIG. 6.

FIG. 8B is a diagram illustrating a third bit-state mapping relation deduced from the first bit-state mapping relation of FIG. 8A.

FIG. 13A is a diagram illustrating a first bit-state mapping relation for encoding data to be programmed to a second word line among the page data shown in FIG. 11.

FIG. 13B is a diagram illustrating a third bit-state mapping relation deduced from the first bit-state mapping relation of FIG. 13A.

FIG. 15 is a flowchart illustrating a method of operating a semiconductor memory device in accordance with an embodiment of the present disclosure.

FIG. 16A is a flowchart illustrating in detail step S110 of FIG. 15.

DETAILED DESCRIPTION

Figure 1:
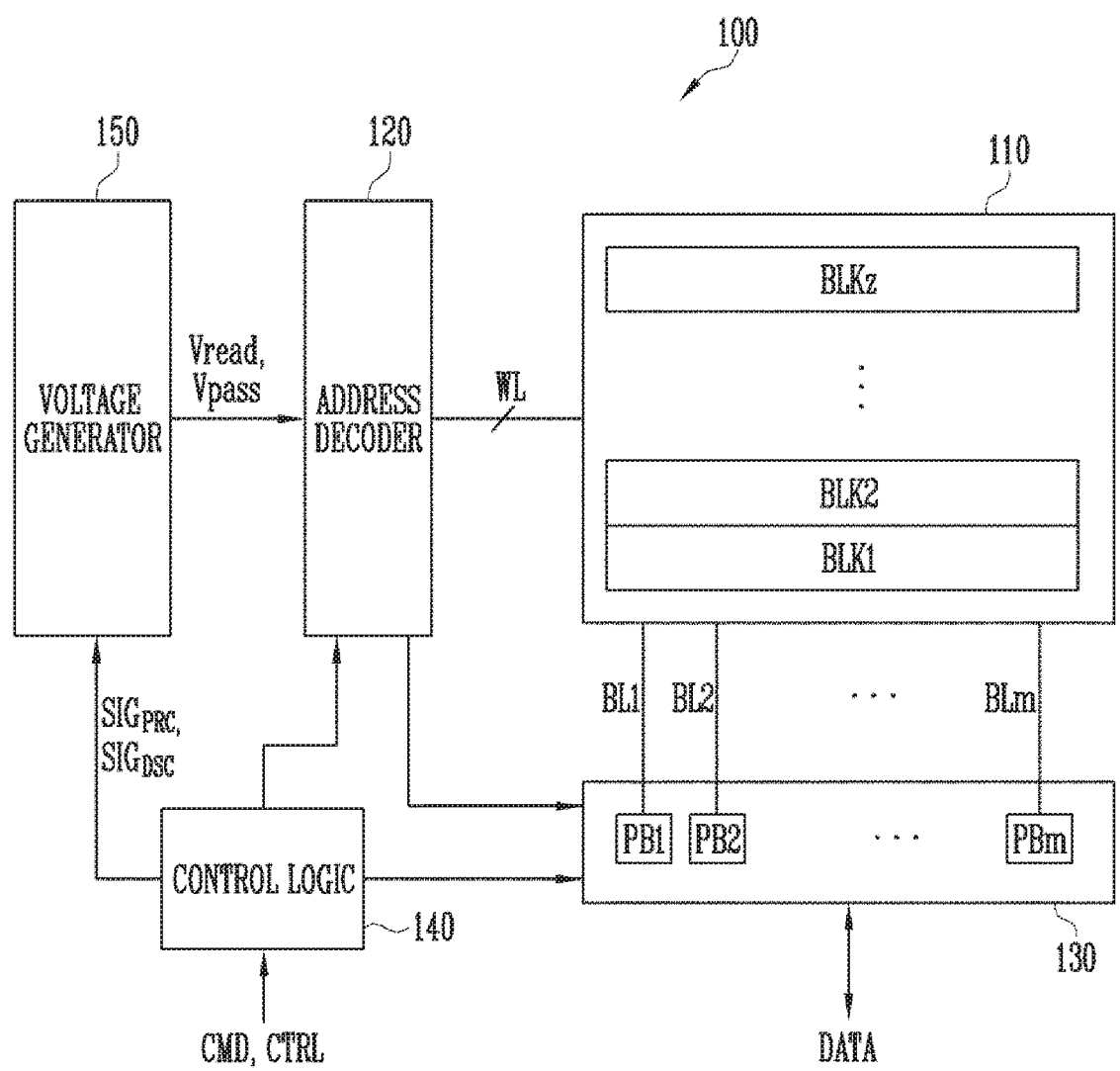
FIG. 1 is a block diagram illustrating a semiconductor memory device in accordance with an embodiment of the present disclosure.

Example embodiments will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to identify various components, but they should not limit the various components. Those terms are only used for the purpose of differentiating a component from other components. For example, a first component in one instance may be referred to as a second component in another instance, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a block diagram illustrating a semiconductor memory device 100 in accordance with an embodiment of the present disclosure.

Referring to FIG. 1, the semiconductor memory device 100 includes a memory cell array 110, an address decoder 120, a read/write circuit 130, a control logic 140, and a voltage generator 150.

The memory cell array 110 includes a plurality of memory blocks BLK1 to BLKz. The memory blocks BLK1 to BLKz are coupled to the address decoder 120 through word lines WL. The memory blocks BLK1 to BLKz are coupled to the read/write circuit 130 through bit lines BL1 to BLm. Each of the memory blocks BLK1 to BLKz includes a plurality of memory cells. In an embodiment, the memory cells may be nonvolatile memory cells and be formed of nonvolatile memory cells having a vertical channel structure. The memory cell array 110 may be formed of a memory cell array having a two-dimensional structure. In an embodiment, the memory cell array 110 may be formed of a memory cell array having a three-dimensional structure. Each of the memory cells included in the memory cell array may store at least one bit of data. In an embodiment, each of the memory cells included in the memory cell array 110 may be a single-level cell (SLC), which stores 1-bit data. In an embodiment, each of the memory cells included in the memory cell array 110 may be a multi-level cell (MLC), which stores 2-bit data. In an embodiment, each of the memory cells included in the memory cell array 110 may be a triple-level cell (TLC), which stores 3-bit data. In an embodiment, each of the memory cells included in the memory cell array 110 may be a quad-level cell (QLC), which stores 4-bit data. In various embodiments, the memory cell array 110 may include a plurality of memory cells each of which stores 5 or more bits of data.

The address decoder 120, the read/write circuit 130, the control logic 140, and the voltage generator 150 are operated as peripheral circuits for driving the memory cell array 110. The address decoder 120 is coupled to the memory cell array 110 through the word lines WL. The address decoder 120 may operate under control of the control logic 140. The address decoder 120 may receive addresses through an input/output buffer (not shown) provided in the semiconductor memory device 100.

The address decoder 120 may decode a block address among the received addresses. The address decoder 120 may select at least one memory block based on the decoded block address. When a read voltage application operation is performed during a read operation, the address decoder 120 may apply a read voltage Vread generated from the voltage generator 150, to a selected word line of a selected memory block and apply a pass voltage Vpass to the other unselected word lines. During a program verify operation, the address decoder 120 may apply a verify voltage generated from the voltage generator 150, to a selected word line of a selected memory block, and apply a pass voltage Vpass to the other unselected word lines.

The address decoder 120 may decode a column address among the received addresses. The address decoder 120 may transmit the decoded column address to the read/write circuit 130.

The read or program operation of the semiconductor memory device 100 is performed on a page basis. Addresses received in a request for a read or program operation may include a block address, a row address and a column address. The address decoder 120 may select one memory block and one-word line in response to a block address and a row address. The column address may be decoded by the address decoder 120 and provided to the read/write circuit 130.

The address decoder 120 may include a block decoder, a row decoder, a column decoder, an address buffer, etc.

The read/write circuit 130 includes a plurality of page buffers PB1 to PBm. The read/write circuit 130 may be operated as a read circuit during a read operation of the memory cell array 110 and as a write circuit during a write operation. The page buffers PB1 to PBm are coupled to the memory cell array 110 through the bit lines BL1 to BLm. During a read operation or a program verify operation, to sense threshold voltages of the memory cells, the page buffers PB1 to PBm may continuously supply sensing current to the bit lines coupled to the memory cells, and each page buffer may sense, through a sensing node, a change in the amount of flowing current depending on a program state of a corresponding memory cell and latch it as sensing data. The read/write circuit 130 is operated in response to page buffer control signals outputted from the control logic 140.

During a read operation, the read/write circuit 130 may sense data of the memory cells and temporarily store readout data, and then output data DATA to the input/output buffer (not shown) of the semiconductor memory device 100. In an embodiment, the read/write circuit 130 may include a column select circuit or the like as well as the page buffers (or page registers).

The control logic 140 is coupled to the address decoder 120, the read/write circuit 130, and the voltage generator 150. The control logic 140 may receive a command CMD and a control signal CTRL through the input/output buffer (not shown) of the semiconductor memory device 100. The control logic 140 may control the overall operation of the semiconductor memory device 100 in response to the control signal CTRL. The control logic 140 may output a control signal for controlling the sensing node precharge potential levels of the plurality of page buffers PB1 to PBm. The control logic 140 may control the read/write circuit 130 to perform a read operation of the memory cell array 110.

The voltage generator 150 may generate a read voltage Vread and a pass voltage Vpass during a read operation in response to a control signal outputted from the control logic 140. The voltage generator 150 may include, so as to generate a plurality of voltages having various voltage levels, a plurality of pumping capacitors configured to receive an internal supply voltage, and may generate a plurality of voltages by selectively enabling the plurality of pumping capacitors under control of the control logic 140.

The address decoder 120, the read/write circuit 130, and the voltage generator 150 may function as peripheral circuits for performing a read operation, a write operation, or an erase operation on the memory cell array 110. The peripheral circuits may perform a read operation, a write operation, or an erase operation on the memory cell array 110 under control of the control logic 140.

In an embodiment of the present disclosure, during a program operation on memory cells included in the memory cell array 110, the control logic 140 may control the peripheral circuits to program first partial data of shared page data to memory cells coupled to a first word line of the plurality of word lines WL, and program second partial data of the shared page data to memory cells coupled to a second word line different from the first word line. Hence, some of the shared page data is programmed to the memory cells coupled to the first word line, and some of the shared page data is programmed to the memory cells coupled to the second word line. Thereby, the amount of data which is stored in the memory cells may be increased, so that the degree of data integration of the semiconductor memory device may be enhanced.

Here, first page data is programmed to the memory cells coupled to the first word line along with the first partial data of the shared page data. Second page data is programmed to the memory cells coupled to the second word line along with the second partial data of the shared page data. In other words, the first page data is stored in the memory cells coupled to the first word line, and the second page data is stored in the memory cells coupled to the second word line. The shared page data is programmed to the memory cells coupled to the first and the second word lines. Such a method of programming data will be described in detail later herein with reference to FIGS. 5 to 16B.

Figure 2:
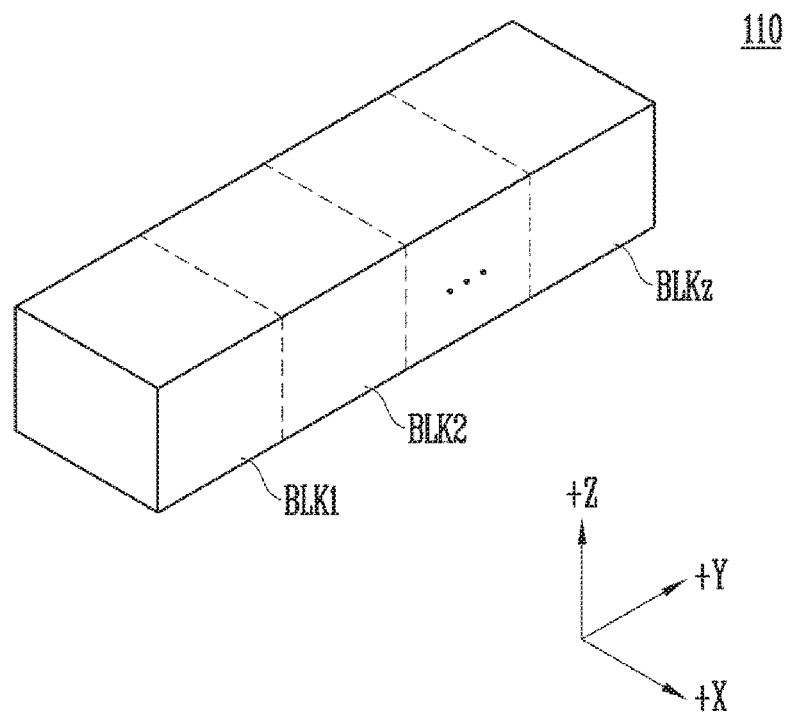
FIG. 2 is a block diagram illustrating a memory cell array of FIG. 1, in accordance with an embodiment of the present disclosure.

FIG. 2 is a diagram illustrating a memory cell array of FIG. 1, in accordance with an embodiment of the present disclosure.

Referring to FIG. 2, the memory cell array 110 may include a plurality of memory blocks BLK1 to BLKz. Each memory block may have a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 3 and 4.

In an embodiment, each memory block included in the memory cell array 110 may have a two-dimensional structure.

Figure 3:
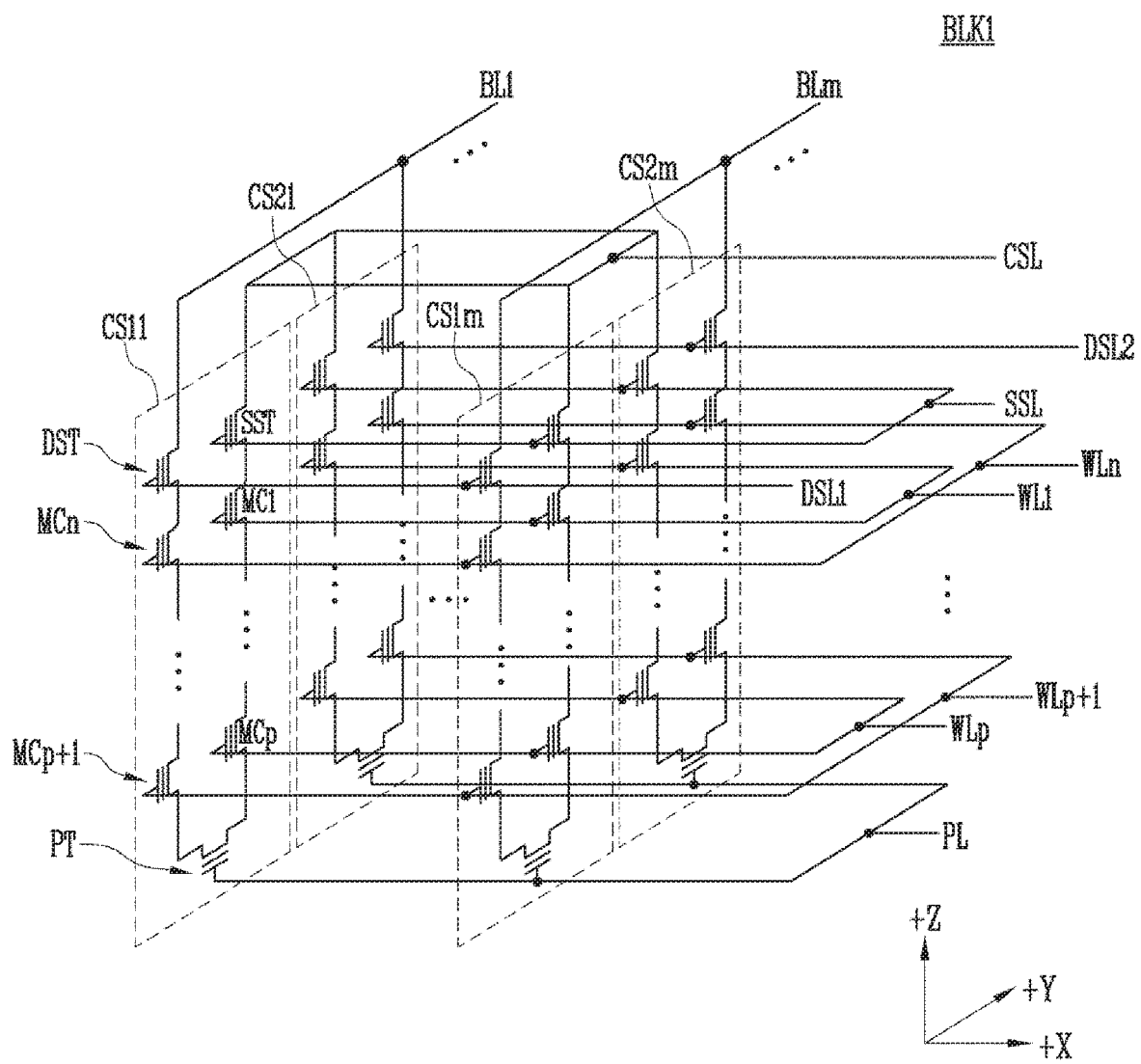
FIG. 3 is a circuit diagram illustrating an example of any one of memory blocks of FIG. 2, in accordance with an embodiment of the present disclosure.

FIG. 3 is a circuit diagram illustrating any one memory block BLKa of memory blocks BLK1 to BLKz of FIG. 2, in accordance with an embodiment of the present disclosure.

Referring to FIG. 3, the memory block BLKa may include a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings may be arranged in a row direction (i.e., the +X direction). In FIG. 3, two cell strings are illustrated as being arranged in a column direction (i.e., the +Y direction). However, this illustration is made only for convenience of description, and it will be understood that three or more cell strings may be arranged in the column direction.

Each of the plurality of cell strings CS11 to CS1$m$ and CS21 to CS2$m$ may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layers, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 3, the source select transistors of the cell strings CS11 to CS1$m$ and CS21 to CS2$m$ may be coupled in common to a single source select line SSL.

In an embodiment, the source select transistors of the cell strings CS11 to CS1$m$ in a first row are coupled to a first source select line. The source select transistors of the cell strings CS21 to CS2$m$ in a second row are coupled to a second source select line.

The first to n-th memory cells MC1 to MCn in each cell string are coupled between the source select transistor SST and the drain select transistor DST.

The first to n-th memory cells MC1 to MCn may be divided into first to to p-th memory cells MC1 to MCp and p+1-th to n-th memory cells MCp+1 to MCn. The first to p-th memory cells MC1 to MCp are successively arranged in a direction opposite to the +Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1$m$ in the first row are coupled to a first drain select line DSL1. Drain select transistors of the cell strings CS21 to CS2$m$ in the second row are coupled to a second drain select line DSL2.

Cell strings arranged in the column direction may be coupled to bit lines extending in the column direction. In FIG. 3, cell strings CS11 and CS21 in a first column are coupled to a first bit line BL1. Cell strings CS1$m$ and CS2$m$ in an m-th column are coupled to an m-th bit line BLm.

Memory cells coupled to the same word line in cell strings arranged in the row direction form a single page. For example, memory cells coupled to the first word line WL1, among the cell strings CS11 to CS1$m$ in the first row, form a single page. Memory cells coupled to the first word line WL1, among the cell strings CS21 to CS2$m$ in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number-th cell strings of the cell strings CS11 to CS1$m$ or CS21 to CS2$m$ arranged in the row direction may be coupled to respective even bit lines. Odd-number-th cell strings of the cell strings CS11 to CS1$m$ or CS21 to CS2$m$ arranged in the row direction may be coupled to respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCp. Alternatively, at least one or more dummy memory cells may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the at least one dummy memory cells, each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 4:
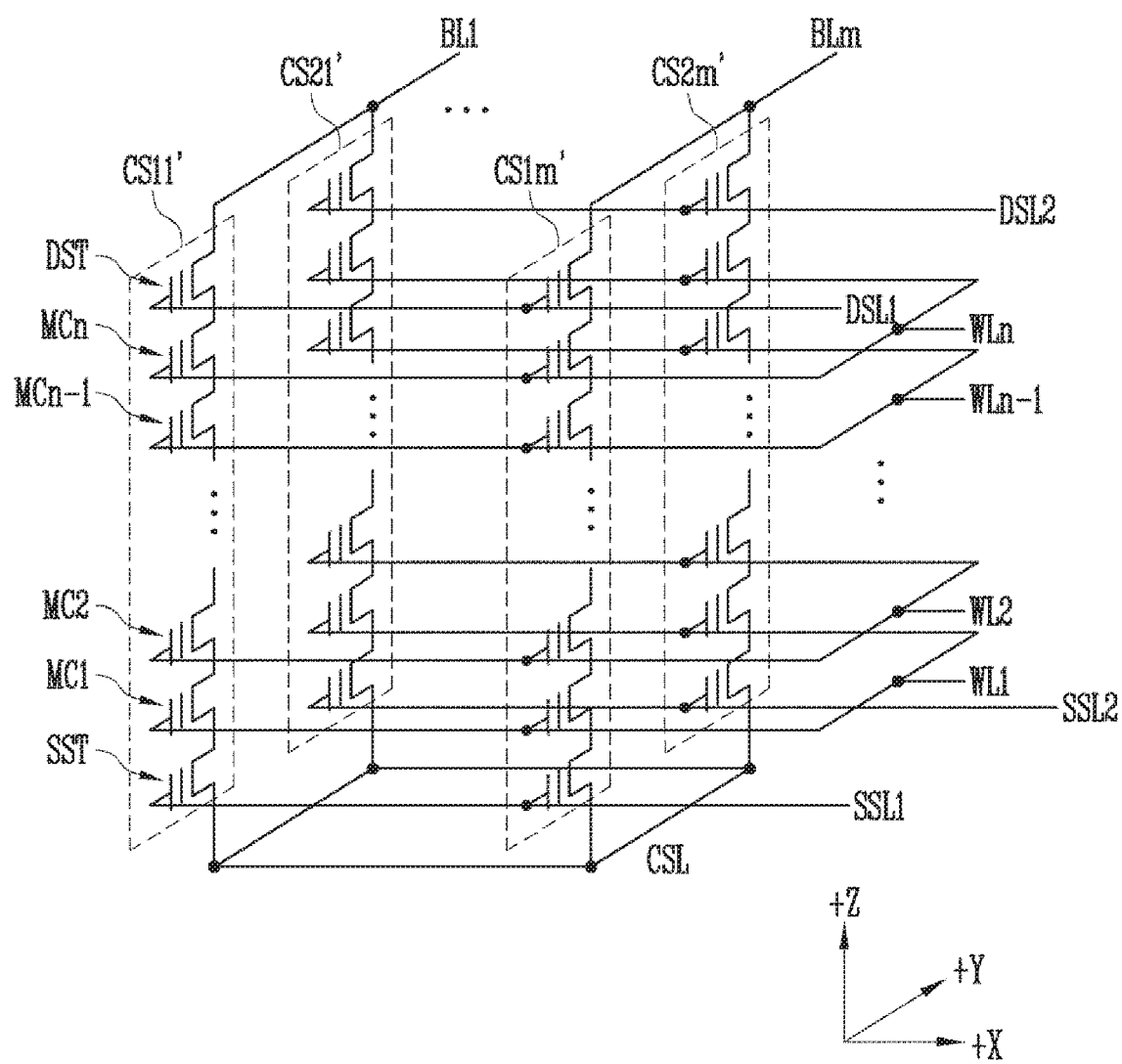
FIG. 4 is a circuit diagram illustrating an example of any one of the memory blocks of FIG. 2, in accordance with an embodiment of the present disclosure.

FIG. 4 is a circuit diagram illustrating any one memory block BLKb of the memory blocks BLK1 to BLKz of FIG. 2, in accordance with an embodiment of the present disclosure.

Referring to FIG. 4, the memory block BLKb may include a plurality of cell strings CS11' to CS1m' and CS21' to CS2m'. Each of the cell strings CS11' to CS1m' and CS21' to CS2m' extends in the +Z direction. Each of the cell strings CS11' to CS1m' and CS21' to CS2m' may include at least one source select transistor SST, first to n-th memory cells MC1 to MCn, and at least one drain select transistor DST which are stacked on a substrate (not shown) provided in a lower portion of the memory block BLKb.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

Consequentially, the memory block BLKb of FIG. 4 may have an equivalent circuit similar to that of the memory block BLKa of FIG. 3 except that a pipe transistor PT is excluded from each cell string.

In an embodiment, even bit lines and odd bit lines may be provided in lieu of the first to m-th bit lines BL1 to BLm. Even-number-th cell strings among the cell strings CS11' to CS1m' or CS21' to CS2m' arranged in the row direction may be coupled to the respective even bit lines, and odd-number-th cell strings among the cell strings CS11' to CS1m' or CS21' to CS2m' arranged in the row direction may be coupled to the respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCn. Alternatively, at least one or more dummy memory cells may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the at least one dummy memory cells, each of the dummy memory cells may have a required threshold voltage. Before or after an erase operation on the memory block BLKb is performed, program operations may be performed on all or some of the dummy memory cells. In the case where an erase operation is to be performed after a program operation has been performed, the dummy memory cells may have required threshold voltages by controlling voltages to be applied to the dummy word lines coupled to the respective dummy memory cells.

Figure 5:
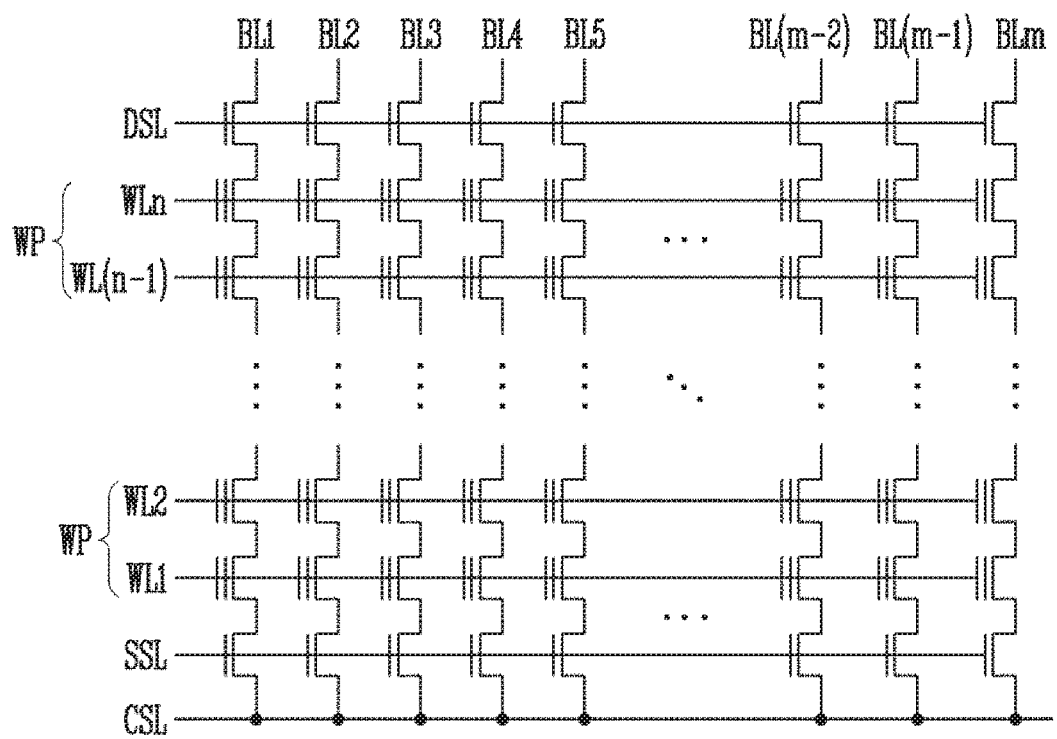
FIG. 5 is a circuit diagram illustrating word line pairs coupled to memory cells to which data is to be stored, in accordance with an embodiment of the present disclosure.

FIG. 5 is a circuit diagram illustrating word line pairs coupled to memory cells to which data is to be stored, in accordance with an embodiment of the present disclosure. FIG. 5 illustrates in more detail word lines coupled to a memory block and memory cells coupled to the word lines. The memory cells shown in FIG. 5 may be memory cells included in the memory block BLKa or BLKb shown in FIG. 3 or 4. In an embodiment, the memory cells shown in FIG. 5 may be memory cells included in a memory block having a two-dimensional structure.

The memory block may include a plurality of cell strings coupled to the respective bit lines BL1 to BLm. Each of the cell strings includes a drain select transistor, a plurality of memory cells coupled in series to each other, and a source select transistor. The drain select transistors of the cell strings are coupled in common to a drain select line DSL. Memory cells disposed on each row line are coupled in common to a corresponding one of the first to n-th word lines WL1 to WLn. The source select transistors of the cell strings are coupled to a source select line SSL.

In the semiconductor memory device in accordance with an embodiment of the present disclosure, shared page data are stored in memory cells coupled to a plurality of word lines. For example, a piece of shared page data may be stored in memory cells coupled to two-word lines WL1 and WL2. In this case, the word liens WL1 and WL2 may form one-word line pair WP. In other words, the shared page data may be stored in the memory cells coupled to the one-word line pair WP. Referring to FIG. 5, there is illustrated an embodiment in which two-word lines disposed adjacent to each other form one-word line pair WP. However, the present disclosure is not limited to this, and word line pairs may be formed in various ways. For example, word lines WL1 and WL3 may form one-word line pair, word lines WL2 and WL4 may form one-word line pair, word lines WL5 and WL7 may form one-word line pair, and word lines WL6 and WL8 may form one-word line pair. In addition, it will be understood that word line pairs may be provided in various forms, as needed. For the sake of description, the following descriptions will be focused on an embodiment in which two-word lines disposed adjacent to each other form one-word line pair, as shown in FIG. 5.

Figure 6:
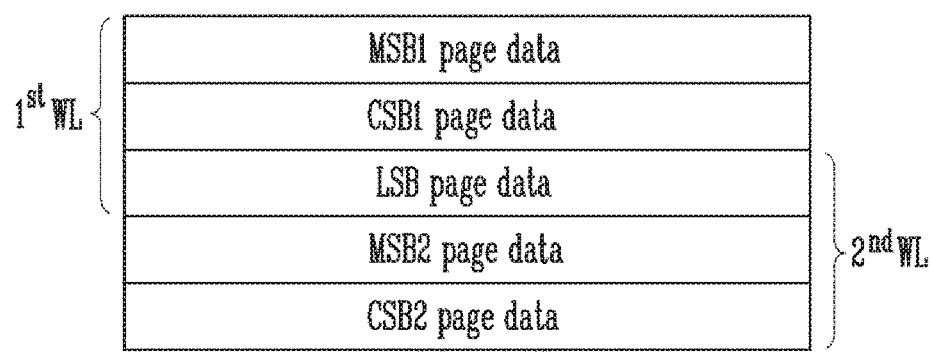
FIG. 6 is a diagram illustrating an example of page data to be stored in memory cells coupled to two-word lines, in accordance with an embodiment of the present disclosure.

FIG. 6 is a diagram illustrating an example of page data to be stored in memory cells coupled to two-word lines or one-word line pair, in accordance with an embodiment of the present disclosure.

Referring to FIG. 6, five pieces of page data are stored in memory cells included in one-word line pair. Hereinafter, descriptions will be made with reference to FIGS. 5 and 6.

For example, the case where the page data shown in FIG. 6 is programmed to memory cells coupled to the word lines WL1 and WL2 of FIG. 5 will be described. As shown in FIG. 5, m memory cells are coupled to each word line. Hence, each of the five pieces of page data shown in FIG. 6 may include m bits.

The page data shown in FIG. 6 includes first most significant bit (MSB1) page data, first central significant bit (CSB1) page data, least significant bit (LSB) page data, second most significant bit (MSB2) page data, and second central significant bit (CSB2) page data. The MSB1 page data and the CSB1 page data are stored in memory cells coupled to a first word line 1st WL. For example, the first word line 1st WL may be the word line WL1 of FIG. 5. The MSB2 page data and the CSB2 page data are stored in memory cells coupled to a second word line 2nd WL. For example, the second word line 2nd WL may be the word line WL2 of FIG. 5.

The LSB page data is stored in the memory cells coupled to the first word line 1st WL and the second word line 2nd WL. In the sense that page data is stored in memory cells coupled to two-word lines, the LSB page data may be referred to as "shared page data". The MSB1 page data and the CSB1 page data that are stored in only the memory cells coupled to the first word line 1st WL may be referred to as "first page data". The MSB2 page data and the CSB2 page data that are stored in only the memory cells coupled to the second word line 2nd WL may be referred to as "second page data".

Referring to FIGS. 5 and 6, five pieces of page data are stored in memory cells coupled to two-word lines or one-word line pair. In other words, 5-bit data is stored in two memory cells. Hence, according to the embodiment shown in FIG. 6, 2.5-bit data is stored in each memory cell.

In the case of a triple-level cell TLC in which 3-bit data is stored in each memory cell, threshold voltages of memory cells are required to be distributed into eight levels. In this case, there is a problem in that distribution margins between distributions are reduced, whereby the error rate increases due to disturbance.

In an embodiment of the present disclosure, 2.5-bit data is stored in each memory cell, so that the threshold voltages of the memory cells are distributed into six levels. In this case, the distribution margin may be increased, compared to that of the TLC. Therefore, the degree of data integration of the semiconductor memory device may be enhanced.

A detailed method of storing five pieces of page data in memory cells coupled to two-word lines will be described with reference to FIGS. 7A to 10B.

FIG. 7A is a diagram illustrating a first bit-state mapping relation for encoding data to be programmed to the first word line among the page data shown in FIG. 6. FIG. 7B is a diagram illustrating a second bit-state mapping relation deduced from the first bit-state mapping relation of FIG. 7A.

Hereinafter, referring to FIGS. 7A and 7B, a process of generating the second bit-state mapping relation will be described.

Referring to FIG. 7A, there is illustrated the first bit-state mapping relation for encoding the MSB1 page data, the CSB1 page data, and the LSB page data to be programmed to the first word line. The first bit-state mapping relation may correspond to states of eight levels. That is, the first bit-state mapping relation corresponds to first to eighth states from the left side. In the case where the codes of the states are expressed in a sequence of the first most significant bit MSB1, the first central significant bit CSB1, and the least significant bit LSB, the code of the first state is "1 1 1", the code of the second state is "1 1 0", the code of the third state is "1 0 0", and the code of the fourth state is "1 0 1". Furthermore, the code of the fifth state is "0 0 1", the code of the sixth state is "0 0 0", the code of the seventh state is "0 1 0", and the code of the eighth state is "0 1 1".

Some of the eight states included in the first bit-state mapping relation may be combined with each other to generate the second bit-state mapping relation. For example, as indicated in black in FIG. 7A, the first and the second states may be combined with each other, and the third and the fourth states may be combined with each other. Thereby, the second bit-state mapping relation shown in FIG. 7B may be generated. In this case, among the bits of the LSB page data, the bits corresponding to the first to the fourth states may become don't care bits, and may not be programmed to the memory cells coupled to the first word line. Here, among the bits of the LSB page data, only the bits corresponding to the fifth to the eighth states may be programmed to the memory cells coupled to the first word line.

The combination of the first and the second states of FIG. 7A becomes an erase state E of FIG. 7B. In addition, the combination of the third and the fourth states of FIG. 7A becomes a first program state P1 of FIG. 7B. The fifth to the eighth states of FIG. 7A respectively become second to fifth program states P2 to P5 of FIG. 7B. As shown in FIG. 7B, neither the erase state E nor the first program state P1 may include LSB page data. On the other hand, the second to the fifth program states P2 to P5 may include LSB page data. According to the second bit-state mapping relation shown in FIG. 7B, the least significant bits to be programmed to the memory cells coupled to the first word line may be referred to as "first partial data" in terms of the fact that the least significant bits are some of the LSB page data. In other words, the first partial data may be data to be programmed to the memory cells coupled to the first word line among the LSB page data.

Referring to FIG. 7B, the second bit-state mapping relation includes the erase state E and the first to the fifth program states P1 to P5. Therefore, the MSB1 page data, the CSB1 page data, and some of the LSB page data may be encoded in distributions of a total of six levels. According to the second bit-state mapping relation shown in FIG. 7B, the MSB1 page data, the CSB1 page data, and some of the LSB page data that are shown in FIG. 6 may be programmed to the memory cells coupled to the first word line 1st WL.

FIG. 8A is a diagram illustrating a first bit-state mapping relation for encoding data to be programmed to the second word line among the page data shown in FIG. 6. FIG. 8B is a diagram illustrating a third bit-state mapping relation deduced from the first bit-state mapping relation of FIG. 8A.

Hereinafter, referring to FIGS. 8A and 8B, a process of generating the third bit-state mapping relation will be described.

Referring to FIG. 8A, there is illustrated the first bit-state mapping relation for encoding the MSB2 page data, the CSB2 page data, and the LSB page data to be programmed to the second word line. The first bit-state mapping relation may correspond to states of eight levels. That is, the first bit-state mapping relation corresponds to first to eighth states from the left side. The first bit-state mapping relation shown in FIG. 8A may be substantially the same as the bit-state mapping relation shown in FIG. 7A. In the case where the codes of the states are expressed in a sequence of the second most significant bit MSB2, the second central significant bit CSB2, and the least significant bit LSB, the code of the first state is "1 1 1", the code of the second state is "1 1 0", the code of the third state is "1 0 0", and the code of the fourth state is "1 0 1". Furthermore, the code of the fifth state is "0 0 1", the code of the sixth state is "0 0 0", the code of the seventh state is "0 1 0", and the code of the eighth state is "0 1 1".

Some of the eight states included in the first bit-state mapping relation may be combined with each other to generate the third bit-state mapping relation. For example, as indicated in black in FIG. 8A, the fifth and the sixth states may be combined with each other, and the seventh and the eighth states may be combined with each other. Thereby, the third bit-state mapping relation shown in FIG. 8B is generated. In this case, among the bits of the LSB page data, the bits corresponding to the fifth to the eight states may become don't care bits, and may not be programmed to the memory cells coupled to the second word line. Here, among the bits of the LSB page data, only the bits corresponding to the first to the fourth states may be programmed to the memory cells coupled to the second word line.

In addition, the combination of the fifth and the sixth states of FIG. 8A becomes a fourth program state P4 of FIG. 8B. In addition, the combination of the seventh and the eighth states of FIG. 8A becomes a fifth program state P5 of FIG. 8B. The first to the fourth states of FIG. 8A respectively become an erase state E and first to third program states P1 to P3 of FIG. 8B. As shown in FIG. 8B, neither the fourth program state P4 nor the fifth program state P5 may include LSB page data. On the other hand, the erase state E and the first to the third program states P1 to P3 may include LSB page data. According to the third bit-state mapping relation shown in FIG. 8B, the least significant bits to be programmed to the memory cells coupled to the second word line may be referred to as "second partial data" in terms of the fact that the least significant bits are some of the LSB page data. In other words, the second partial data may be data to be programmed to the memory cells coupled to the second word line among the LSB page data.

Referring to FIG. 8B, the third bit-state mapping relation includes the erase state E and the first to the fifth program states P1 to P5. Therefore, the MSB2 page data, the CSB2 page data, and some of the LSB page data may be encoded in distributions of total six levels. According to the third bit-state mapping relation shown in FIG. 8B, the MSB2 page data, the CSB2 page data, and some of the LSB page data that are shown in FIG. 6 may be programmed to the memory cells coupled to the second word line 2nd WL.

Figure 9A:
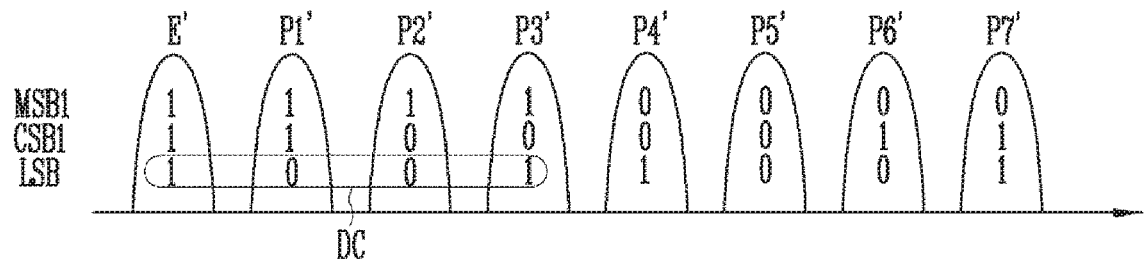
FIG. 9A is a diagram for describing the first bit-state mapping relation shown in FIG. 7A and states belonging thereto.

FIG. 9A is a diagram for describing the first bit-state mapping relation shown in FIG. 7A and states belonging thereto.

Referring to FIGS. 7A and 9A together, a threshold voltage correspondence relation of states E', P1', P2', P3', P4', P5', P6', and P7' of eight levels included in the first bit-state mapping relation will be described. The erase state E', and the first to the third program states P1' to P3' of the first bit-state mapping relation are combined with each other. Thereby, the least significant bits LSB corresponding to the erase state E' and the first to the third program states P1' to P3' become don't care bits DC.

Figure 9B:
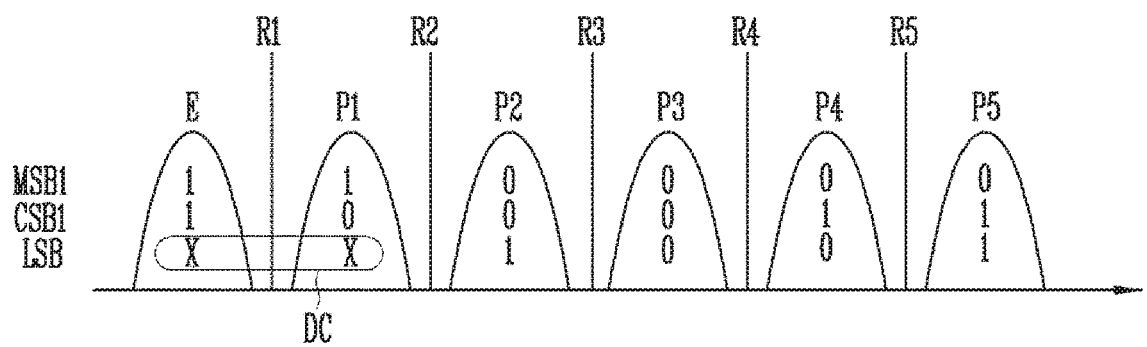
FIG. 9B is a diagram for describing the second bit-state mapping relation shown in FIG. 7B and states belonging thereto.

FIG. 9B is a diagram for describing the second bit-state mapping relation shown in FIG. 7B and states belonging thereto. Referring to FIGS. 9A and 9B together, the second bit-state mapping relation is generated by combining the erase state E' and the first to the third program states P1' to P3' of the first bit-state mapping relation with each other. In other words, a combination of the erase state E' and the first program state P1' of FIG. 9A becomes the erase state E of FIG. 9B. In addition, a combination of the second program state P2' and the third program state P3' of FIG. 9A becomes the first program state P1 of FIG. 9B. Furthermore, the fourth to the seventh program states P4' to P7' of FIG. 9A respectively become the second to the fifth program states P2 to P5 of FIG. 9B. As shown in FIG. 9B, each of the erase state E and the first program state P1 includes information about only the first most significant bit MSB1 and the first central significant bit CSB1 without including information about the least significant bit LSB. On the other hand, each of the second to the fifth program states P2 to P5 includes information about the first most significant bit MSB1, the first central significant bit CSB1, and the least significant bit LSB. Here, read voltages R1 to R5 may be set to distinguish the states included in the second bit-state mapping relation from each other.

The read/write circuit 130 shown in FIG. 1 may program the MSB1 page data, the CSB1 page data, and the first partial data of the LSB page data that are shown in FIG. 6 to the memory cells coupled to the first word line 1st WL, based on the second bit-state mapping relation shown in FIGS. 7B and 9B. The control logic 140 may control the program operation of the read/write circuit 130. As such, since the MSB1 page data, the CSB1 page data, and the first partial data of the LSB page data are programmed to the memory cells coupled to the first word line 1st WL, each of the page buffers PB1 to PBm may include latches for storing three bits.

Figure 10A:
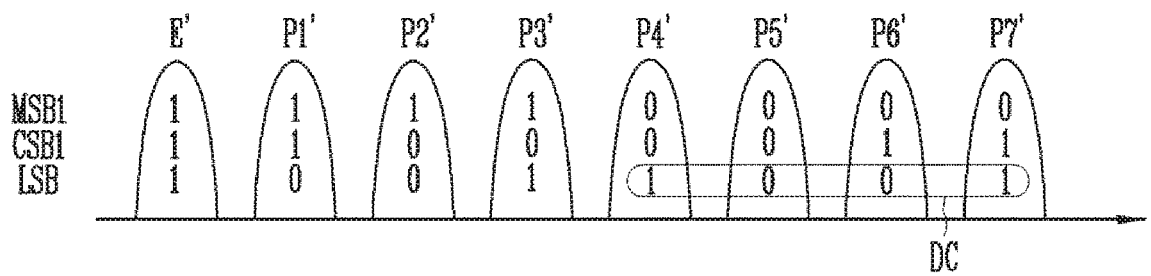
FIG. 10A is a diagram for describing the first bit-state mapping relation shown in FIG. 8A and states belonging thereto.

FIG. 10A is a diagram for describing the first bit-state mapping relation shown in FIG. 8A and states belonging thereto.

Referring to FIGS. 8A and 10A together, a threshold voltage correspondence relation of states E', P1', P2', P3', P4', P5', P6', and P7' of eight levels included in the first bit-state mapping relation will be described. The fourth to the seventh program states P4' to P7' of the first bit-state mapping relation are combined with each other. Thereby, the least significant bits LSB corresponding to the fourth to the seventh program states P4' to P7' become don't care bits DC.

Figure 10B:
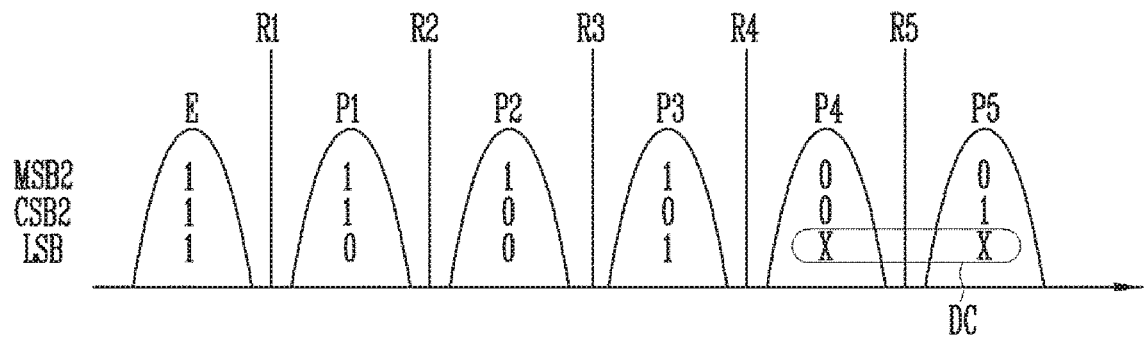
FIG. 10B is a diagram for describing the third bit-state mapping relation shown in FIG. 8B and states belonging thereto.

FIG. 10B is a diagram for describing the third bit-state mapping relation shown in FIG. 8B and states belonging thereto. Referring to FIGS. 10A and 10B together, the third bit-state mapping relation is generated by combining the fourth to the seventh program states P4' to P7' of the first bit-state mapping relation with each other. In detail, a combination of the fourth program state P4' and the fifth program state P5' of FIG. 10A becomes the fourth program state P4 of FIG. 10B. In addition, a combination of the sixth program state P6' and the seventh program state P7' of FIG. 10A becomes the fifth program state P5 of FIG. 10B. Furthermore, the first to the third program states P1' to P3' of FIG. 10A respectively become the first to the third program states P1 to P3 of FIG. 10B. As shown in FIG. 10B, each of the fourth and the fifth program states P4 and P5 includes information about only the second most significant bit MSB2 and the second central significant bit CSB2 without including information about the least significant bit LSB. On the other hand, each of the erase state E and the first to the third program states P1 to P3 includes information about the second most significant bit MSB2, the second central significant bit CSB2, and the least significant bit LSB. Here, read voltages R1 to R5 may be set to distinguish the states included in the third bit-state mapping relation from each other.

The read/write circuit 130 shown in FIG. 1 may program the MSB2 page data, the CSB2 page data, and the second partial data of the LSB page data that are shown in FIG. 6 to the memory cells coupled to the second word line 2nd WL, based on the third bit-state mapping relation shown in FIGS. 8B and 10B. The control logic 140 may control the program operation of the read/write circuit 130. As such, since the MSB2 page data, the CSB2 page data, and the second partial data of the LSB page data are programmed to the memory cells coupled to the second word line 2nd WL, each of the page buffers PB1 to PBm may include latches for storing three bits.

In FIGS. 7A to 10B, there has been illustrated the case where the second bit-state mapping relation is generated by combining the first to the fourth states of the first bit-state mapping relation with each other, and the third bit-state mapping relation is generated by combining the fifth to the eighth states of the first bit-state mapping relation with each other. However, this is only for illustrative purposes, and the semiconductor memory device and the method of operating the semiconductor memory device in accordance with embodiments of the present disclosure are not limited thereto. For example, the second bit-state mapping relation may be generated by combining the fifth to the eighth states of the first bit-state mapping relation with each other, and the third bit-state mapping relation may be generated by combining the first to the fourth states of the first bit-state mapping relation with each other. Alternatively, the second bit-state mapping relation may be generated by combining the first, the second, the seventh, and the eighth states of the first bit-state mapping relation with each other, and the third bit-state mapping relation may be generated by combining the third to the sixth states of the first bit-state mapping relation with each other. As such, the method of generating the second and the third bit-state mapping relations based on the first bit-state mapping relation may be embodied in various ways.

The semiconductor memory device 100 in accordance with an embodiment of the present disclosure may program data to the memory cells coupled to the first and the second word lines 1st WL and 2nd WL, based on a multi-step program scheme. In an embodiment, the semiconductor memory device 100 may program data to the memory cells coupled to the first and the second word lines 1st WL and 2nd WL, based on a one-shot program scheme. The multi-step program scheme refers to a scheme of performing at least two program operations to program a plurality of pieces of page data to memory cells coupled to one-word line. Here, each of the at least two program operations may include a plurality of program loops. For example, the multi-step program scheme may include various program schemes such as a shadow program scheme and a reprogram scheme. The one-shot program scheme refers to a scheme of performing a single program operation to program a plurality of pieces of page data to memory cells coupled to one-word line.

Figures 11, 12A, 12B:
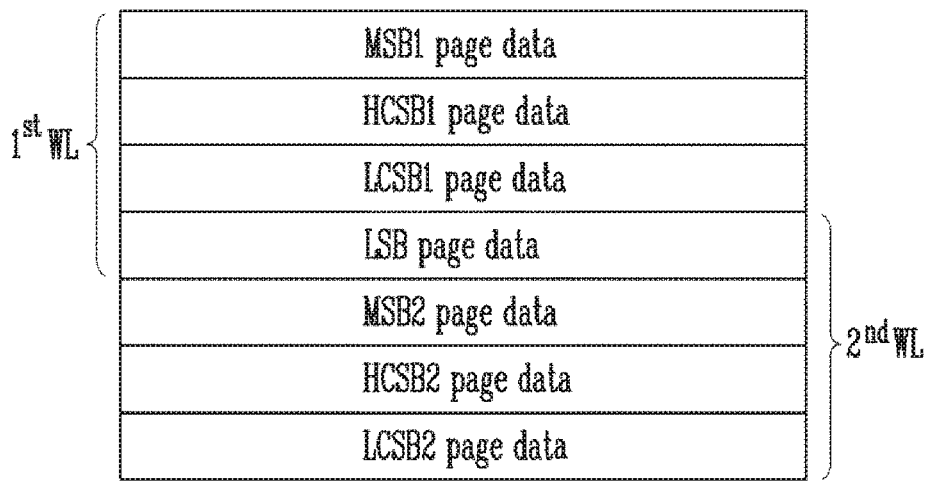
FIG. 11 is a diagram illustrating an example of page data to be stored in memory cells coupled to two-word lines, in accordance with an embodiment of the present disclosure.
FIG. 12A is a diagram illustrating a first bit-state mapping relation for encoding data to be programmed to a first word line among the page data shown in FIG. 11.
FIG. 12B is a diagram illustrating a second bit-state mapping relation deduced from the first bit-state mapping relation of FIG. 12A.

FIG. 11 is a diagram illustrating an example of page data to be stored in memory cells coupled to two-word lines or one-word line pair, in accordance with an embodiment of the present disclosure.

Referring to FIG. 11, seven pieces of page data are stored in memory cells included in one-word line pair. Hereinafter, descriptions will be made with reference to FIGS. 5 and 11.

For example, the case where the page data shown in FIG. 11 is programmed to memory cells coupled to the word lines WL1 and WL2 of FIG. 5 will be described. As shown in FIG. 5, m memory cells are coupled to each word line. Hence, each of the seven pieces of page data shown in FIG. 11 may include m bits.

The page data shown in FIG. 11 includes first most significant bit (MSB1) page data, first higher-central significant bit (HCSB1) page data, first lower-central significant bit (LCSB1) page data, least significant bit (LSB) page data, second most significant bit (MSB2) page data, second higher-central significant bit (HCSB2) page data, and second lower-central significant bit (LCSB2) page data. The MSB1 page data, the HCSB1 page data, and the LCSB1 page data are stored in memory cells coupled to a first word line 1st WL. For example, the first word line 1st WL may be the word line WL1 of FIG. 5. The MSB2 page data, the HCSB2 page data, and the LCSB2 page data are stored in memory cells coupled to a second word line 2nd WL. For example, the second word line 2nd WL may be the word line WL2 of FIG. 5.

The LSB page data, i.e., shared page data, is stored in the memory cells coupled to the first word line 1st WL and the second word line 2nd WL. In the sense that page data is stored in memory cells coupled to two-word lines, the LSB page data may be referred to as "shared page data". The MSB1 page data, the HCSB1 page data, and the LCSB1 page data that are stored in only the memory cells coupled to the first word line 1st WL may be referred to as "first page data". The MSB2 page data, the HCSB2 page data, and the LCSB2 page data that are stored in only the memory cells coupled to the second word line 2nd WL may be referred to as "second page data".

Referring to FIGS. 5 and 11, seven pieces of page data are stored in memory cells coupled to two-word lines or one-word line pair. In other words, 7-bit data is stored in two memory cells. Hence, according to the embodiment shown in FIG. 11, 3.5-bit data is stored in each memory cell.

In the case of a quad-level cell QLC in which 4-bit data is stored in each memory cell, threshold voltages of memory cells are required to be distributed into sixteen levels. In this case, there is a problem in that distribution margins between distributions are reduced, whereby the error rate increases due to disturbance.

In an embodiment of the present disclosure, 3.5-bit data is stored in each memory cell, so that the threshold voltages of the memory cells are distributed into twelve levels. In this case, the distribution margin may be increased, compared to that of the QLC. Therefore, the degree of data integration of the semiconductor memory device may be enhanced.

A detailed method of storing seven pieces of page data in memory cells coupled to two-word lines will be described with reference to FIGS. 12A to 14B.

FIG. 12A is a diagram illustrating a first bit-state mapping relation for encoding data to be programmed to the first word line among the page data shown in FIG. 11. FIG. 12B is a diagram illustrating a second bit-state mapping relation deduced from the first bit-state mapping relation of FIG. 12A.

Hereinafter, referring to FIGS. 12A and 12B, a process of generating the second bit-state mapping relation will be described. The process of generating the second bit-state mapping relation is similar to that described with reference to FIGS. 7A and 7B, other than the fact that the number of pieces of page data and the number of bits are different from those of the embodiment of FIGS. 7A and 7B. Therefore, repetitive explanation will be omitted.

Referring to FIG. 12A, there is illustrated the first bit-state mapping relation for encoding the MSB1 page data, the HCSB1 page data, the LCSB1 page data, and the LSB page data to be programmed to the first word line. The first bit-state mapping relation may correspond to states of sixteen levels. That is, the first bit-state mapping relation corresponds to first to sixteenth states from the left side. In the case where the codes of the states are expressed in a sequence of the first most significant bit MSB1, the first higher-central significant bit HCSB1, the first lower-central significant bit LCSB1, and the least significant bit LSB, the codes of the first to the sixteenth states are respectively "1 1 1 1", "1 1 1 0", "1 0 1 0", "1 0 1 1", 1 0 0 1", "1 0 0 0", "0 0 0 0", "0 0 0 1", "0 0 1 1", "0 0 1 0", "0 1 1 0", "0 1 1 1", "0 1 0 1", "0 1 0 0", "1 1 0 0", and "1 1 0 1".

Some of the sixteen states included in the first bit-state mapping relation may be combined with each other to generate the second bit-state mapping relation. For example, as indicated in black in FIG. 12A, the first and the second states may be combined with each other, the third and the fourth states may be combined with each other, the fifth and the sixth states may be combined with each other, and the seventh and the eighth states may be combined with each other. Based on this, the second bit-state mapping relation shown in FIG. 12B may be generated.

Referring to FIG. 12B, the second bit-state mapping relation includes an erase state E and first to eleventh program states P1 to P11. Therefore, the MSB1 page data, the HCSB1 page data, the LCSB1 page data, and some of the LSB page data may be encoded in distributions of a total of twelve levels. According to the second bit-state mapping relation shown in FIG. 12B, the MSB1 page data, the HCSB1 page data, the LCSB1 page data, and some of the LSB page data that are shown in FIG. 11 may be programmed to the memory cells coupled to the first word line 1st WL.

FIG. 13A is a diagram illustrating a first bit-state mapping relation for encoding data to be programmed to the second word line among the page data shown in FIG. 11. FIG. 13B is a diagram illustrating a third bit-state mapping relation deduced from the first bit-state mapping relation of FIG. 13A.

Hereinafter, referring to FIGS. 13A and 13B, a process of generating the third bit-state mapping relation will be described. The process of generating the third bit-state mapping relation is similar to that described with reference to FIGS. 8A and 8B, other than the fact that the number of pieces of page data and the number of bits are different from those of the embodiment of FIGS. 8A and 8B. Therefore, repetitive explanation will be omitted.

Referring to FIG. 13A, there is illustrated the first bit-state mapping relation for encoding the MSB2 page data, the HCSB2 page data, the LCSB2 page data, and the LSB page data to be programmed to the second word line. The first bit-state mapping relation may correspond to states of sixteen levels. That is, the first bit-state mapping relation corresponds to first to sixteenth states from the left side. In the case where the codes of the states are expressed in a sequence of the second most significant bit MSB2, the second higher-central significant bit HCSB2, the second lower-central significant bit LCSB2, and the least significant bit LSB, the codes of the first to the sixteenth states are respectively "1 1 1 1", "1 1 1 0", "1 0 1 0", "1 0 1 1", 1 0 0 1", "1 0 0 0", "0 0 0 0", "0 0 0 1", "0 0 1 1", "0 0 1 0", "0 1 1 0", "0 1 1 1", "0 1 0 1", "0 1 0 0", "1 1 0 0", and "1 1 0 1".

Some of the sixteen states included in the first bit-state mapping relation may be combined with each other to generate the third bit-state mapping relation. For example, as indicated in black in FIG. 13A, the ninth and the tenth states may be combined with each other, the eleventh and the twelfth states may be combined with each other, the thirteenth and the fourteenth states may be combined with each other, and the fifteenth and the sixteenth states may be combined with each other. Based on this, the third bit-state mapping relation shown in FIG. 13B may be generated.

Referring to FIG. 13B, the third bit-state mapping relation includes an erase state E and first to eleventh program states P1 to P11. Therefore, the MSB2 page data, the HCSB2 page data, the LCSB2 page data, and some of the LSB page data may be encoded in distributions of a total of twelve levels. According to the third bit-state mapping relation shown in FIG. 13B, the MSB2 page data, the HCSB2 page data, the LCSB2 page data, and some of the LSB page data that are shown in FIG. 11 may be programmed to the memory cells coupled to the second word line 2nd WL.

Referring to FIGS. 12A to 13B, there is illustrated an embodiment where the second bit-state mapping relation is generated by combining the first to the eighth states of the first bit-state mapping relation with each other, and the third bit-state mapping relation is to generated by combining the ninth to the sixteenth states of the first bit-state mapping relation with each other However, the semiconductor memory device and the method of operating the semiconductor memory device in accordance with embodiments of the present disclosure are not limited to this. As described above, the method of generating the second and the third bit-state mapping relations based on the first bit-state mapping relation may be embodied in various ways.

Figure 14A:
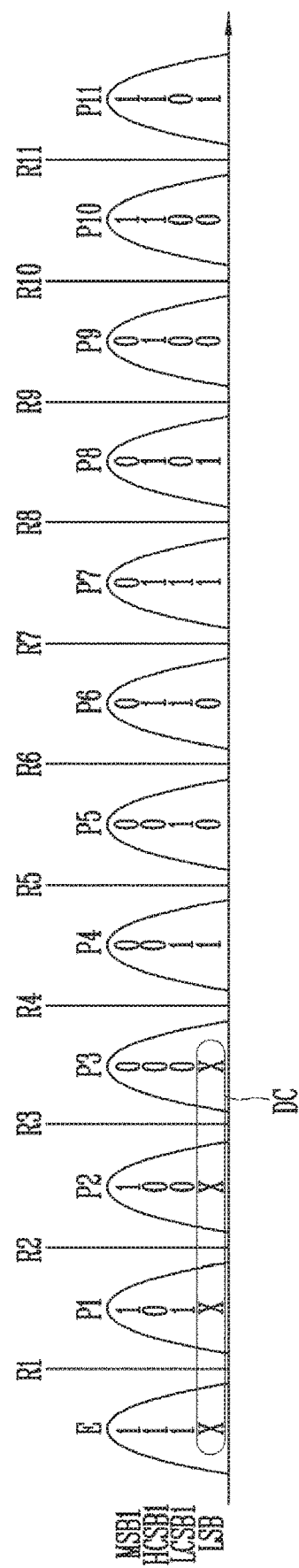
FIG. 14A is a diagram for describing the second bit-state mapping relation shown in FIG. 12B and states belonging thereto.
Figure 14B:
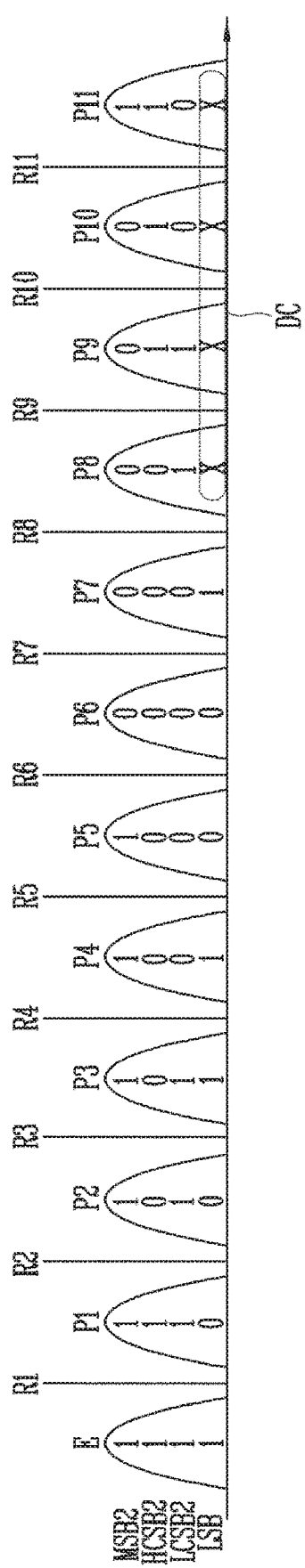
FIG. 14B is a diagram for describing the third bit-state mapping relation shown in FIG. 13B and states belonging thereto.

FIG. 14A is a diagram for describing the second bit-state mapping relation shown in FIG. 12B and states belonging thereto. FIG. 14B is a diagram for describing the third bit-state mapping relation shown in FIG. 13B and states belonging thereto. As shown in FIG. 14A, each of the erase state E and the first to the third program states P1 to P3 includes information about only the first most significant bit MSB1, the first higher-central significant bit HCSB1, and the first lower-central significant bit LCSB1 without including information about the least significant bit LSB. On the other hand, each of the fourth to the eleventh program states P4 to P11 includes information about the first most significant bit MSB1, the first higher-central significant bit HCSB1, the first lower-central significant bit LCSB1, and the least significant bit LSB. Here, read voltages R1 to R11 may be set to distinguish the states included in the second bit-state mapping relation from each other.

As shown in FIG. 14B, each of the eighth to the eleventh program states P8 and P11 includes information about only the second most significant bit MSB2, the second higher-central significant bit HCSB2, and the second lower-central significant bit LCSB2 without including information about the least significant bit LSB. On the other hand, each of the erase state E and the first to the seventh program states P1 to P7 includes information about the second most significant bit MSB2, the second higher-central significant bit HCSB2, and the second lower-central significant bit LCSB2, and the least significant bit LSB. Here, read voltages R1 to R11 may be set to distinguish the states included in the third bit-state mapping relation from each other.

FIG. 15 is a flowchart illustrating a method of operating the semiconductor memory device 100 in accordance with an embodiment of the present disclosure.

Referring to FIG. 15, data may be programmed to memory cells included in a word line pair WP by the method of operating the semiconductor memory device 100. In detail, the method of operating the semiconductor memory device 100 includes step S110 of programming first partial data among shared page data and first page data to memory cells coupled to a first word line, and step S130 of programming second partial data among the shared page data and second page data to memory cells coupled to a second word line. Steps S110 and S130 will be described in detail later with reference to FIGS. 16A and 16B.

FIG. 16A is a flowchart illustrating in detail step S110 of FIG. 15. FIG. 16A illustrates an embodiment in which five pieces of page data are stored in memory cells included in one-word line pair. It should be noted that the method shown in FIG. 16A may be applied in the same manner to an embodiment in which seven pieces of page data are stored in memory cells included in one-word line pair.

Referring to FIG. 16A, step S110 of FIG. 15 includes step S210 of generating a first bit-state mapping relation including states of eight levels for encoding and programming first page data and shared page data, step S230 of generating a second bit-state mapping relation including states of six levels by combining first and second states of the first bit-state mapping relation with each other and combining third and fourth states of the first bit-state mapping relation with each other, and step S250 of programming the first page data and first partial data of the shared page data to the memory cells coupled to the first word line based on the second bit-state mapping relation.

At step S210, the first bit-state mapping relation shown in FIGS. 7A and 9A may be generated. Here, the first page data may include the MSB1 page data and the CSB1 page data shown in FIG. 6. The shared page data may be the LSB page data shown in FIG. 6. Thereafter, at step S230, the second bit-state mapping relation shown in FIGS. 7B and 9B may be generated.

At step S250, based on the second bit-state mapping relation, the first page data and the first partial data of the shared page data are programmed to the memory cells coupled to the first word line 1st WL. As described above, the first page data may include the MSB1 page data and the CSB1 page data. The first partial data may be data to be programmed to the memory cells coupled to the first word line 1st WL among the LSB page data. In other words, the first partial data may be data corresponding to the fifth to the eighth states of FIG. 7A among the LSB page data.

If step S250 is terminated, the program operation S110 for the first word line 1st WL is completed.

Figure 16B:
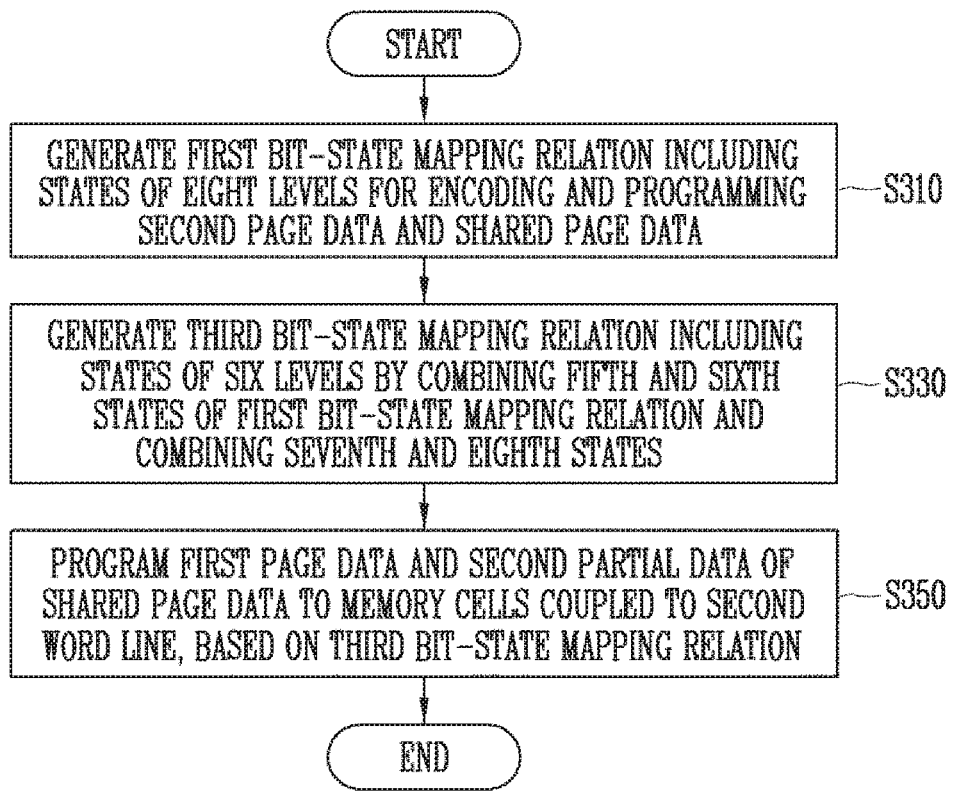
FIG. 16B is a flowchart illustrating in detail step S130 of FIG. 15.

FIG. 16B is a flowchart illustrating in detail step S130 of FIG. 15. FIG. 16B illustrates an embodiment in which five pieces of page data are stored in memory cells included in one-word line pair. It should be noted that the method shown in FIG. 16B may be applied in the same manner to an embodiment in which seven pieces of page data are stored in memory cells included in one-word line pair.

Referring to FIG. 16B, step S130 of FIG. 15 includes step S310 of generating a first bit-state mapping relation including states of eight levels for encoding and programming second page data and shared page data, step S330 of generating a third bit-state mapping relation including states of six levels by combining fifth and sixth states of the first bit-state mapping relation with each other and combining seventh and eighth states of the first bit-state mapping relation with each other, and step S350 of programming the second page data and second partial data of the shared page data to the memory cells coupled to the second word line based on the third bit-state mapping relation.

At step S310, the first bit-state mapping relation shown in FIGS. 8A and 10A may be generated. Here, the second page data may include the MSB2 page data and the CSB2 page data shown in FIG. 6.

The shared page data may be the LSB page data shown in FIG. 6. Thereafter, at step S330, the third bit-state mapping relation shown in FIGS. 8B and 10B may be generated.

At step S350, based on the third bit-state mapping relation, the second page data and the second partial data of the shared page data are programmed to the memory cells coupled to the second word line 2nd WL. As described above, the second page data may include the MSB2 page data and the CSB2 page data. The second partial data may be data to be programmed to the memory cells coupled to the second word line 2nd WL among the LSB page data. In other words, the second partial data may be data corresponding to the first to the fourth states of FIG. 8A among the LSB page data.

If step S350 is terminated, the program operation S130 for the second word line 2nd WL is completed.

Figure 17:
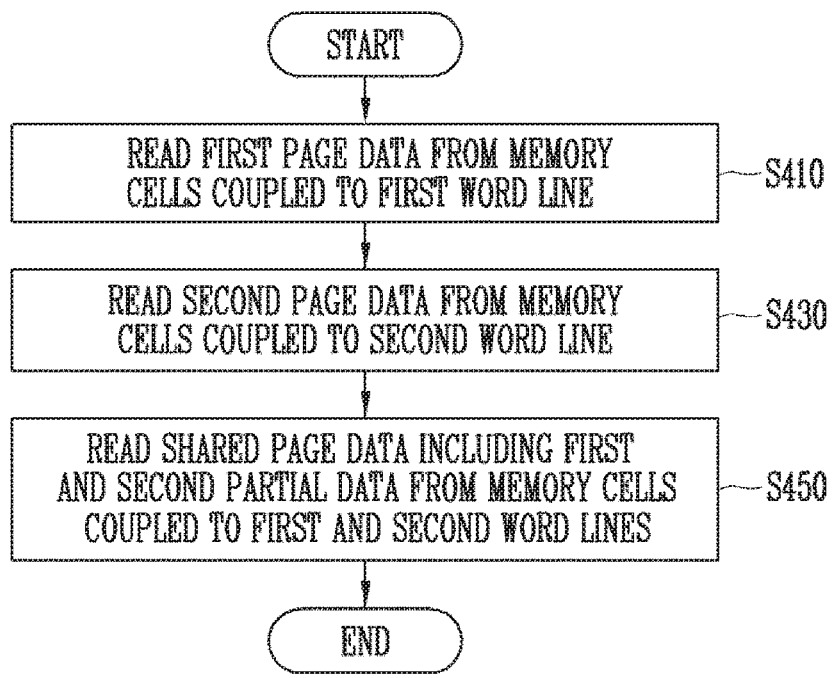
FIG. 17 is a flowchart illustrating a method of operating a semiconductor memory device in accordance with an embodiment of the present disclosure.

FIG. 17 is a flowchart illustrating a method of operating the semiconductor memory device 100 in accordance with an embodiment of the present disclosure. Referring to FIG. 17, data may be read from memory cells included in a word line pair WP by the method of operating the semiconductor memory device 100. In detail, at step S410, first page data is read from the memory cells coupled to the first word line 1st WL. Furthermore, at step S430, second page data is read from the memory cells coupled to the second word line 2nd WL. At step S450, shared page data including first and second partial data is read from the memory cells coupled to the first and the second word lines 1st WL and 2nd WL. Steps S410 to S450 shown in FIG. 17 may be sequentially performed, or alternatively, may be independently performed.

In an embodiment, at step S410, the MSB1 page data and the CSB1 page data stored in the first word line 1st WL may be read. For instance, referring to FIG. 9B, the MSB1 page data may be read by the read voltage R2, and the CSB1 page data may be read by the read voltages R1 and R4.

In an embodiment, at step S410, the MSB1 page data, the HCSB1 page data, and the LCSB1 page data stored in the first word line 1st WL may be read. For instance, referring to FIG. 14A, the MSB1 page data may be read by the read voltages R3 and R10, the HCSB1 page data may be read by the read voltages R1 and R6, and the first LCSB1 page data may be read by the read voltages R2, R4, and R8.

In an embodiment, at step S430, the MSB2 page data and the CSB2 page data stored in the second word line 2nd WL may be read. For instance, referring to FIG. 10B, the MSB2 page data may be read by the read voltage R4, and the CSB2 page data may be read by the read voltages R2 and R5.

In an embodiment, at step S430, the MSB2 page data, the HCSB2 page data, and the LCSB2 page data stored in the second word line 2nd WL may be read. For instance, referring to FIG. 14B, the MSB2 page data may be read by the read voltages R6 and R11, the HCSB2 page data may be read by the read voltages R2 and R9, and the second LCSB2 page data may be read by the read voltages R4, R8, and R10.

As described above, it will be understood that a read voltage required to read the MSB1 page data differs from a read voltage required to read the MSB2 page data. In other words, referring to FIGS. 9B and 10B together, the read voltage R2 is used to read the MSB1 page data while the read voltage R4 is used to read the MSB2 page data. Likewise, a read voltage required to read the CSB1 page data also differs from a read voltage required to read the CSB2 page data. Referring to FIGS. 9B and 10B together, the read voltages R1 and R4 are used to read the CSB1 page data while the read voltages R2 and R5 are used to read the CSB2 page data.

In the same manner, referring to FIGS. 14A and 14B, it will be understood that read voltages required to respectively read the MSB1 page data, the HCSB1 page data, and the LCSB1 page data differ from read voltages required to respectively read the MSB2 page data, the HCSB2 page data, and the LCSB2 page data.

Hereinbelow, the operation that is performed at step S450 will be described in more detail with reference to FIGS. 18 and 19.

Figure 18:
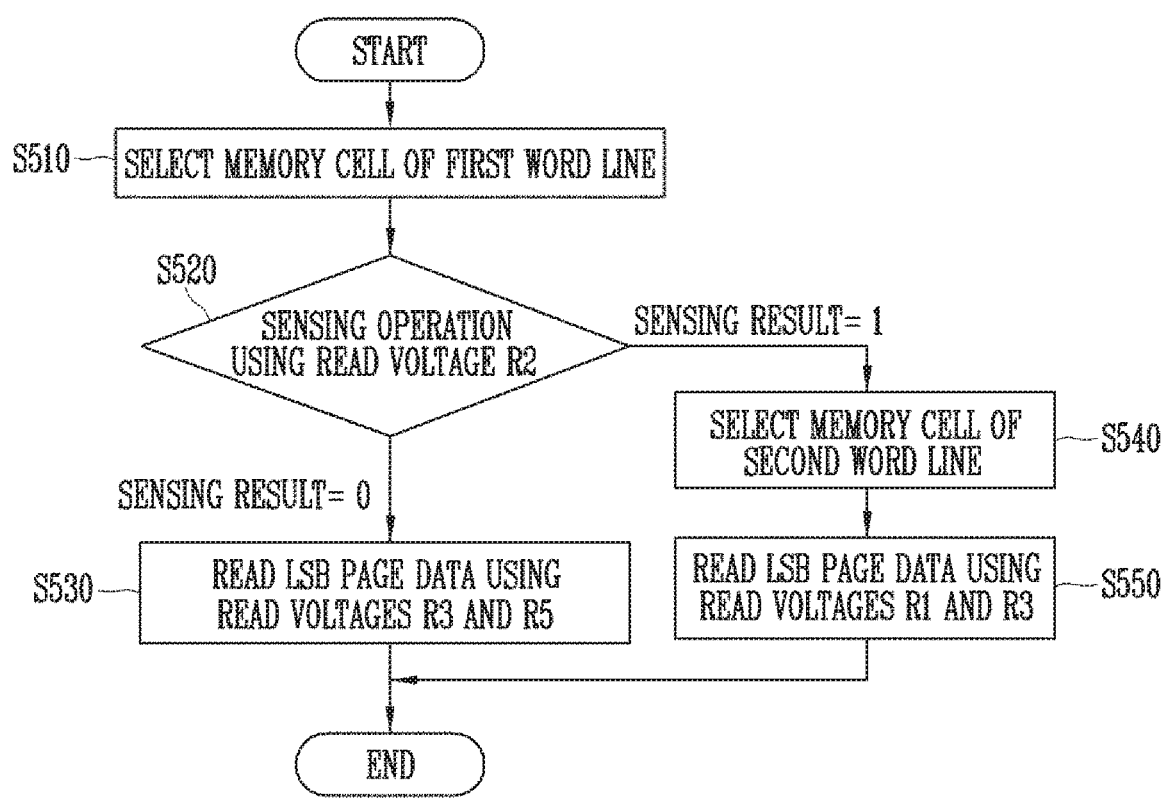
FIG. 18 is a flowchart illustrating in detail an example of step S450 of FIG. 17.

FIG. 18 is a flowchart illustrating in detail an example of step S450 of FIG. 17. At steps S510 to S550, the LSB page data programmed according to FIGS. 9B and 10B is read. Hereinafter, the following description will be made with reference to FIGS. 9B, 10B, and 18 together.

At step S510, a memory cell of the first word line 1st WL is selected. Thereby, the memory cell coupled to the first word line 1st WL is selected. Thereafter, at step S520, the memory cell coupled to the first word line 1st WL is sensed using the read voltage R2.

If the result of the sensing indicates "0", this means that the threshold voltage of the selected memory cell is greater than the read voltage R2. Therefore, the threshold voltage of the corresponding memory cell corresponds to any one of the second to the fifth program states P2 to P5. This means that the selected memory cell includes information about the LSB page data. Hence, the LSB page data, i.e., the shared page data, is read from the memory cell coupled to the first word line 1st WL using the read voltages R3 and R5, at step S530.

If the result of the sensing indicates "1", this means that the threshold voltage of the selected memory cell is less than the read voltage R2. Therefore, the threshold voltage of the corresponding memory cell corresponds to either the erase state E or the first program state P1. This means that the selected memory cell does not include information about the LSB page data. Hence, a memory cell of the second word line 2nd WL is selected, at step S540. The memory cell of the second word line 2nd WL that is selected at step S540 may be disposed on the same column as that of the memory cell of the first word line 1st WL that has been selected at step S510. Subsequently, as shown in FIG. 10B, the LSB page data is read from the memory cell coupled to the second word line 2nd WL using the read voltages R1 and R3, at step S550.

The foregoing steps S510 to S550 are performed on the memory cells corresponding to all columns of the first and the second word lines so that the LSB page data may be read from the memory cells coupled to the first and the second word lines.

Figure 19:
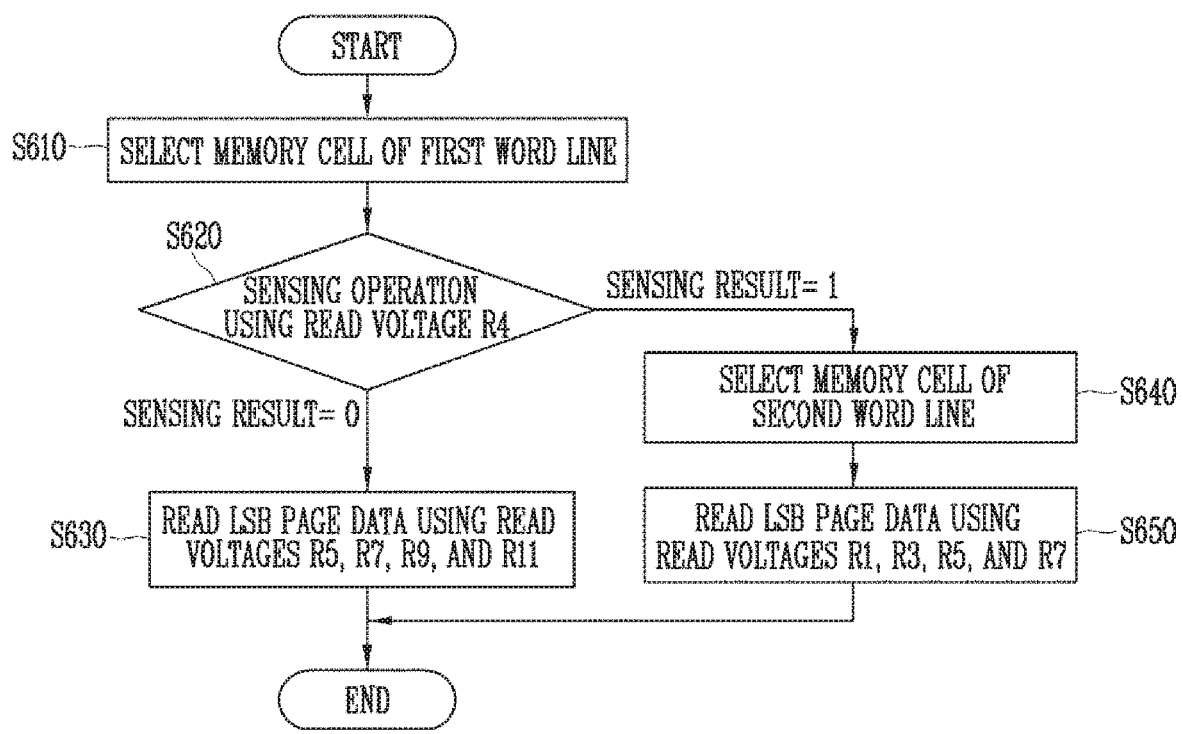
FIG. 19 is a flowchart illustrating in detail an example of step S450 of FIG. 17.

FIG. 19 is a flowchart illustrating in detail an example of step S450 of FIG. 17. At steps S610 to S650, the LSB page data programmed according to FIGS. 14A and 14B is read. The following description will be made with reference with FIGS. 14A, 14B, and 19 together.

At step S610, a memory cell of the first word line 1st WL is selected. Thereby, the memory cell coupled to the first word line 1st WL is selected. Thereafter, at step S620, the memory cell coupled to the first word line 1st WL is sensed using the read voltage R4.

If the result of the sensing indicates "0", this means that the threshold voltage of the selected memory cell is greater than the read voltage R4. Therefore, the threshold voltage of the corresponding memory cell corresponds to any one of the fourth to the eleventh program states P4 to P11. This means that the selected memory cell includes information about the LSB page data. Hence, the LSB page data, i.e., the shared page data, is read from the memory cell coupled to the first word line 1st WL using the read voltages R5, R7, R9, and R11, at step S630.

If the result of the sensing indicates "1", this means that the threshold voltage of the selected memory cell is less than the read voltage R4. Therefore, the threshold voltage of the corresponding memory cell corresponds to any one of the erase state E and the first to the third program states P1 to P3. This means that the selected memory cell does not include information about the LSB page data. Hence, a memory cell of the second word line 2nd WL is selected, at step S640. The memory cell of the second word line 2nd WL that is selected at step S640 may be disposed on the same column as that of the memory cell of the first word line 1st WL that has been selected at step 610. Subsequently, as shown in FIG. 14B, the LSB page data is read from the memory cell coupled to the second word line 2nd WL using the read voltages R1, R3, R5 and R7, at step S650.

The foregoing steps S610 to S650 are performed on the memory cells corresponding to all columns of the first and the second word lines so that the LSB page data may be read from the memory cells coupled to the first and the second word lines.

Figure 20:
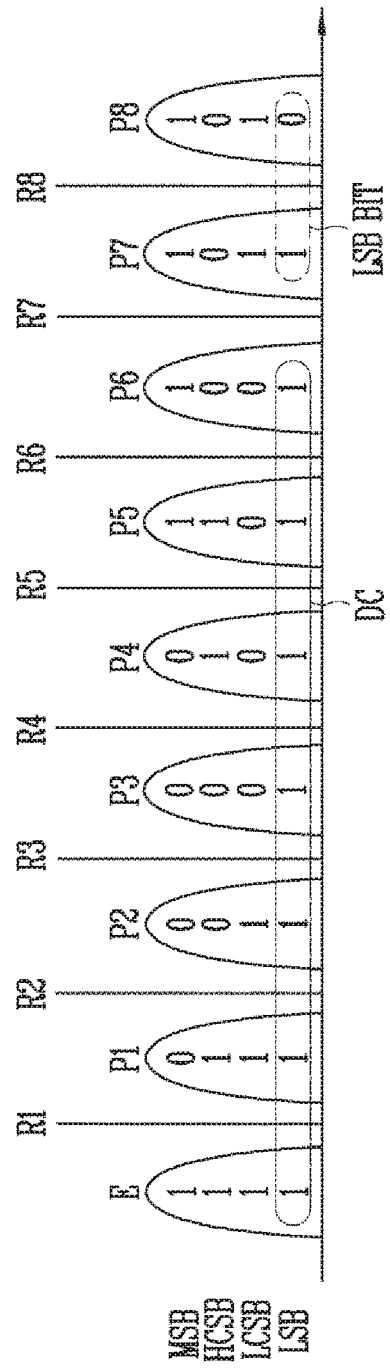
FIG. 20 is a view illustrating a program method of a semiconductor memory device in accordance with an embodiment of the present disclosure.

FIG. 20 is a view illustrating a program method of the semiconductor memory device 100 in accordance with an embodiment of the present disclosure.

Referring to FIG. 20, there are illustrated states E and P1 to P8 of nine levels and a bit mapping relation of the corresponding states with regard to the threshold voltages of the respective memory cells. Referring to FIG. 20, each of the memory cells may intactly store an MSB page bit, an HCSB page bit, or an LCSB page bit. The LSB page bit may be read from memory cells having the seventh and the eighth program states P7 and P8.

In the embodiment shown in FIG. 20, eight physical pages form one program unit. In other words, LSB page data is distributed to and stored in the memory cells having the seventh and the eighth program states P7 and P8 among the memory cells included in the eight physical pages. As described above, each physical page may store MSB page data, HCSB page data, or LCSB page data. On the other hand, LSB page data is distributed to and stored in all of the eight physical pages. Consequently, twenty-five pieces of logical page data may be stored in the total of eight physical pages.

In the embodiment described with reference to FIGS. 11 to 14B, a total of seven pieces of logical page data are stored in memory cells included in two physical pages. That is, on average, data of 3.5 bits is stored in each memory cell.

On the other hand, in the embodiment shown in FIG. 20, a total of twenty-five pieces of logical page data are stored in memory cells included in eight physical pages. That is, on average, data of 3.125 bits is stored in each memory cell.

Furthermore, in the embodiment described with reference to FIGS. 14A and 14B, bit-state mapping relations applied to the two physical pages may be different from each other. On the other hand, in the embodiment shown in FIG. 20, bit-state mapping relations applied to the eight physical pages may be identical with each other.

A program method according to the embodiment shown in FIG. 20 is as follows. First, the memory cells included in the eight physical pages are programmed according to the MSB page data, the HCSB page data, or the LCSB page data corresponding to each physical page. Thereby, each of the memory cells is programmed to have any one of the erase state E, and the first to the sixth program states P1 to P6.

Thereafter, memory cells corresponding to the seventh and eighth program states P7 and P8 among the memory cells included in the eight physical pages are sensed. Subsequently, the sensed memory cells corresponding to the seventh and eighth program states P7 and P8 are successively programmed according to the LSB page data.

Since data received from a memory controller to the semiconductor memory device 100 is randomized data, the number of memory cells corresponding to each of the seventh and eighth program states P7 and P8 may be ⅑ of the total number of memory cells. Therefore, the memory cells corresponding to the seventh and eighth program states P7 and P8 may be programmed according to a bit value of the LSB page data. If the bit value of the LSB page data is "1", the corresponding memory cell remains in the seventh program state P7. If the bit value of the LSB page data is "0", the corresponding memory cell may be programmed to have the eighth program state P8. During the foregoing process, the LSB page data is distributed to and stored in the memory cells included in the eight physical pages. Therefore, the LSB page data is not stored in memory cells corresponding to the erase state E and the first to the sixth program states P1 to P6 among the memory cells, while the LSB page data is stored in only memory cells corresponding to the seventh and the eighth program states P7 and P8.

A read method according to the embodiment shown in FIG. 20 is as follows. First, in order to read the MSB page data, a read operation is performed using the read voltages R1 and R5. To read the HCSB page data, a read operation is performed using the read voltages R2, R4, and R6. To read the LCSB page data, a read operation is performed using the read voltages R3 and R7.

To read the LSB page data, the read voltage R7 is applied to the memory cells included in the eight physical pages, so that memory cells remaining turned off are sensed. The memory cells that remain turned off when the read voltage R7 is applied thereto are memory cells corresponding to any one of the seventh and the eighth program states P7 and P8.

Thereafter, the read voltage R8 is applied to the sensed memory cells, and a result value is obtained. In the case of a memory cell which is turned off, a bit value of the LSB page data is "0". In the case of a memory cell which is turned on, a bit value of the LSB page data is "1". The LSB page data may be read from the result obtained by applying the read voltage R8 to all of the sensed memory cells.

Figure 21:
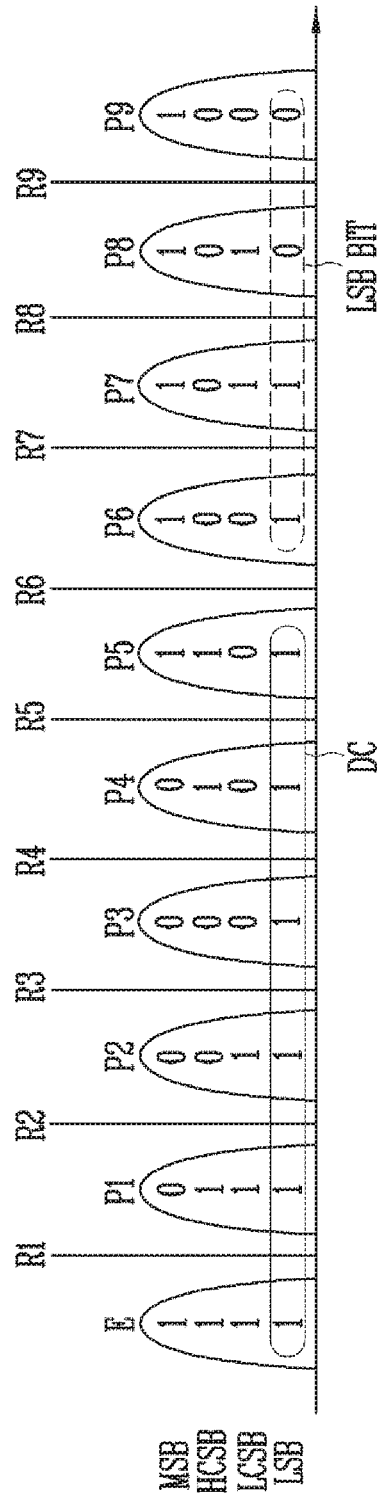
FIG. 21 is a view illustrating a program method of a semiconductor memory device according to an embodiment of the present disclosure.

FIG. 21 is a view illustrating a program method of a semiconductor memory device 100 in accordance with an embodiment of the present disclosure.

Referring to FIG. 21, there are illustrated states E and P1 to P9 of a total of ten levels and a bit mapping relation of the corresponding states with regard to the threshold voltages of the respective memory cells. Referring to FIG. 21, each of the memory cells may intactly store an MSB page bit, an HCSB page bit, or an LCSB page bit. The LSB page bit may be read from memory cells having the sixth to the ninth program states P6 to P9.

In the embodiment shown in FIG. 21, four physical pages form one program unit. In other words, LSB page data is distributed to and stored in the memory cells having the sixth to the ninth program states P6 to P9 among the memory cells included in the fourth physical pages. As described above, each physical page may store MSB page data, HCSB page data, or LCSB page data. On the other hand, LSB page data is distributed to and stored in all of the four physical pages. Consequently, thirteen pieces of logical page data may be stored in the total four physical pages.

In the embodiment described with reference to FIGS. 11 to 14B, a total of seven pieces of logical page data are stored in memory cells included in two physical pages. That is, on average, data of 3.5 bits is stored in each memory cell.

On the other hand, in the embodiment shown in FIG. 21, a total of thirteen pieces of logical page data are stored in memory cells included in four physical pages. That is, on average, data of 3.25 bits is stored in each memory cell.

Furthermore, in the embodiment described with reference to FIGS. 14A and 14B, bit-state mapping relations applied to two physical pages may be different from each other. On the other hand, in the embodiment shown in FIG. 21, bit-state mapping relations applied to the four physical pages may be identical with each other.

A program method according to the embodiment shown in FIG. 21 is as follows. First, the memory cells included in the four physical pages are programmed according to the MSB page data, the HCSB page data, or the LCSB page data corresponding to each physical page. Thereby, each of the memory cells is programmed to have any one of the erase state E, and the first to the fifth program states P1 to P5.

Thereafter, memory cells corresponding to the sixth to ninth program states P6 to P9 among the memory cells included in the four physical pages are sensed. Subsequently, the sensed memory cells corresponding to the sixth to ninth program states P6 to P9 are successively programmed according to the LSB page data.

Since data received from a memory controller to the semiconductor memory device 100 is randomized data, the number of memory cells corresponding to each of the sixth to ninth program states P6 to P9 may be ¹⁄₁₀ of the total number of memory cells. Therefore, the memory cells corresponding to the sixth to ninth program states P6 to P9 may be programmed according to a bit value of the LSB page data.

If the bit value of the LSB page data is "1", the corresponding memory cell remains in the sixth or the seventh program state P6 or P7. If the bit value of the LSB page data is "0", the corresponding memory cell is programmed to have the eighth or the ninth program state P8 or P9.

In more detail, if the bit value of the LSB page data is "1" and the sensed memory cell corresponds to the sixth program state P6, the corresponding memory cell remains in the sixth program state P6. If the bit value of the LSB page data is "1" and the sensed memory cell corresponds to the seventh program state P7, the corresponding memory cell also remains in the seventh program state P7. On the other hand, if the bit value of the LSB page data is "0" and the sensed memory cell corresponds to the sixth program state P6, the corresponding memory cell is programmed to have the ninth program state P9. If the bit value of the LSB page data is "0" and the sensed memory cell corresponds to the seventh program state P7, the corresponding memory cell is programmed to have the eighth program state P8.

During the foregoing process, the LSB page data is distributed to and stored in the memory cells included in the four physical pages. Therefore, the LSB page data is not stored in memory cells corresponding to the erase state E and the first to the fifth program states P1 to P5 among the memory cells, while the LSB page data is stored in only memory cells corresponding to the sixth to the ninth program states P6 to P9.

A read method according to the embodiment shown in FIG. 21 is as follows. First, in order to read the MSB page data, a read operation is performed using the read voltages R1 and R5. To read the HCSB page data, a read operation is performed using the read voltages R2, R4, and R6. To read the LCSB page data, a read operation is performed using the read voltages R3, R7, and R9.

To read the LSB page data, the read voltage R6 is applied to the memory cells included in the four physical pages, so that memory cells remaining turned off are sensed. The memory cells that remain turned off when the read voltage R6 is applied thereto are memory cells corresponding to any one of the sixth to the ninth program states P6 to P9.

Thereafter, the read voltage R8 is applied to the sensed memory cells, and a result value is obtained. In the case of a memory cell which is turned off, a bit value of the LSB page data is "0". In the case of a memory cell which is turned on, a bit value of the LSB page data is "1". The LSB page data may be read from the result obtained by applying the read voltage R8 to all of the sensed memory cells.

Figure 22:
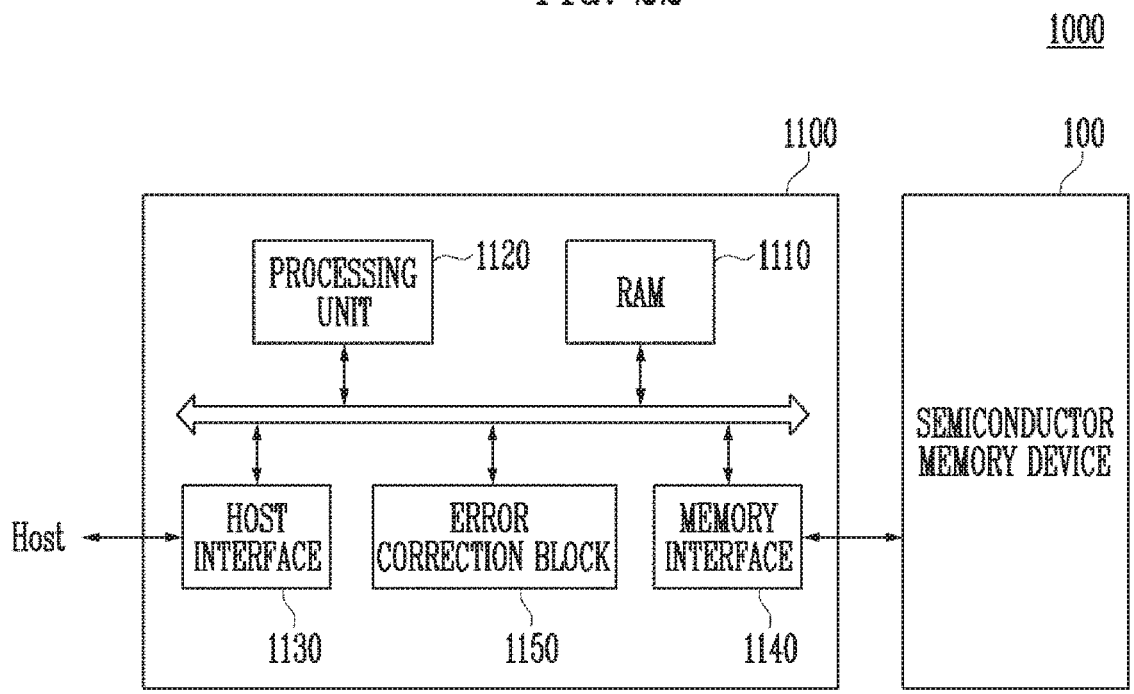
FIG. 22 is a block diagram illustrating a memory system including the semiconductor memory device of FIG. 1.

FIG. 22 is a block diagram illustrating a memory system 1000 including the semiconductor memory device 100 of FIG. 1.

Referring to FIG. 22, the memory system 1000 includes the semiconductor memory device 100 and a controller 1100.

The semiconductor memory device 100 may have the same configuration and operation as those of the semiconductor memory device described with reference to FIGS. 1 to 21. Hereinafter, repetitive explanations will be omitted.

The controller 1100 is coupled to a host and the semiconductor memory device 100. The controller 1100 may access the semiconductor memory device 100 in response to a request from the host. For example, the controller 1100 may control a read operation, a write operation, an erase operation, and a background operation of the semiconductor memory device 100. The controller 1100 may provide an interface between the semiconductor memory device 100 and the host. The controller 1100 may drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as at least one of an operating memory for the processing unit 1120, a cache memory between the semiconductor memory device 100 and the host, and a buffer memory between the semiconductor memory device 100 and the host. The processing unit 1120 may control the overall operation of the controller 1100.

The host interface 1130 may include a protocol for performing data exchange between the host and the controller 1100. In an embodiment, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1140 may interface with the semiconductor memory device 100. For example, the memory interface may include a NAND interface or a NOR interface.

The error correction block 1150 may use an error correcting code (ECC) to detect and correct an error in data received from the semiconductor memory device 100.

The controller 1100 and the semiconductor memory device 100 may be integrated into a single semiconductor device. In an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMC-micro), a SD card (SD, miniSD, microSD, or SDHC), and a universal flash storage (UFS).

The controller 1100 and the semiconductor memory device 100 may be integrated into a single semiconductor device to form a solid state drive (SSD). The SSD may include a storage device configured to store data to a semiconductor memory. When the memory system 1000 is used as the SSD, the operating speed of the host coupled to the memory system 1000 may be phenomenally improved.

In an embodiment, the memory system 1000 may be provided as one of various elements of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 23:
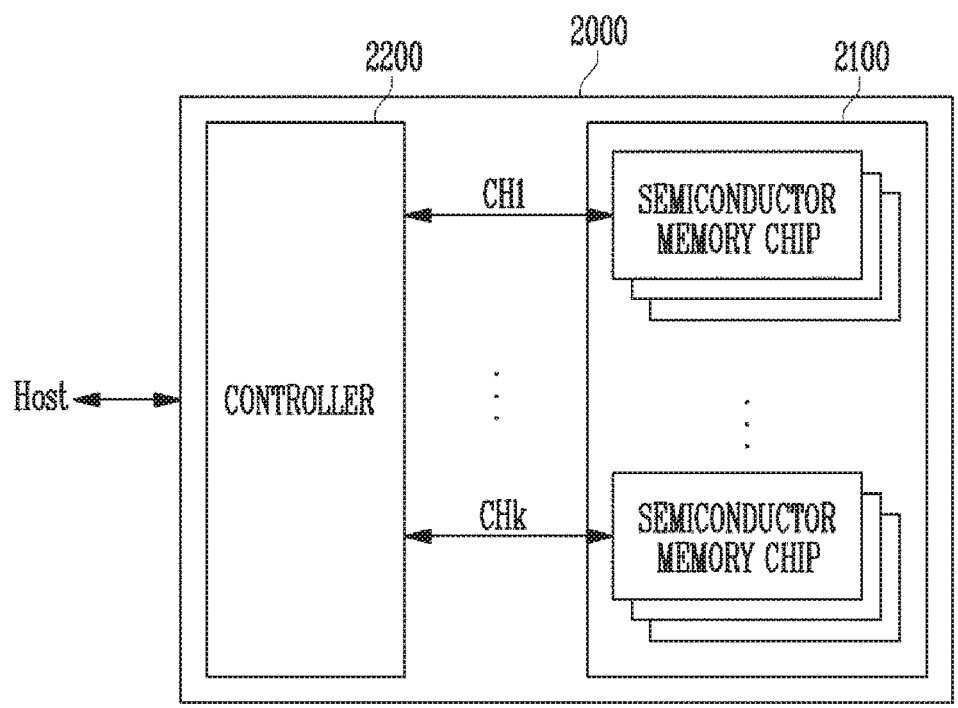
FIG. 23 is a block diagram illustrating an example of application of a memory system of FIG. 22.

FIG. 23 is a block diagram illustrating an example 2000 of application of the memory system 1000 of FIG. 22.

Referring FIG. 23, a memory system 2000 may include a semiconductor memory device 2100 and a controller 2200. The semiconductor memory device 2100 includes a plurality of memory chips. The semiconductor memory chips may be divided into a plurality of groups.

In FIG. 23, it is illustrated that the plurality of groups respectively communicate with the controller 2200 through first to k-th channels CH1 to CHk. Each semiconductor memory chip may have the same configuration and operation as those of a component of the semiconductor memory device 100 described with reference to FIG. 1.

Each group may communicate with the controller 2200 through one common channel. The controller 2200 has the same configuration as that of the controller 1100 described with reference to FIG. 22 and is configured to control a plurality of memory chips of the semiconductor memory device 2100 through the plurality of channels CH1 to CHk.

In FIG. 23, a plurality of semiconductor memory chips has been illustrated as being coupled to each channel. However, it will be understood that the memory system 2000 may be modified into a configuration such that a single memory chip is coupled to each channel.

Figure 24:
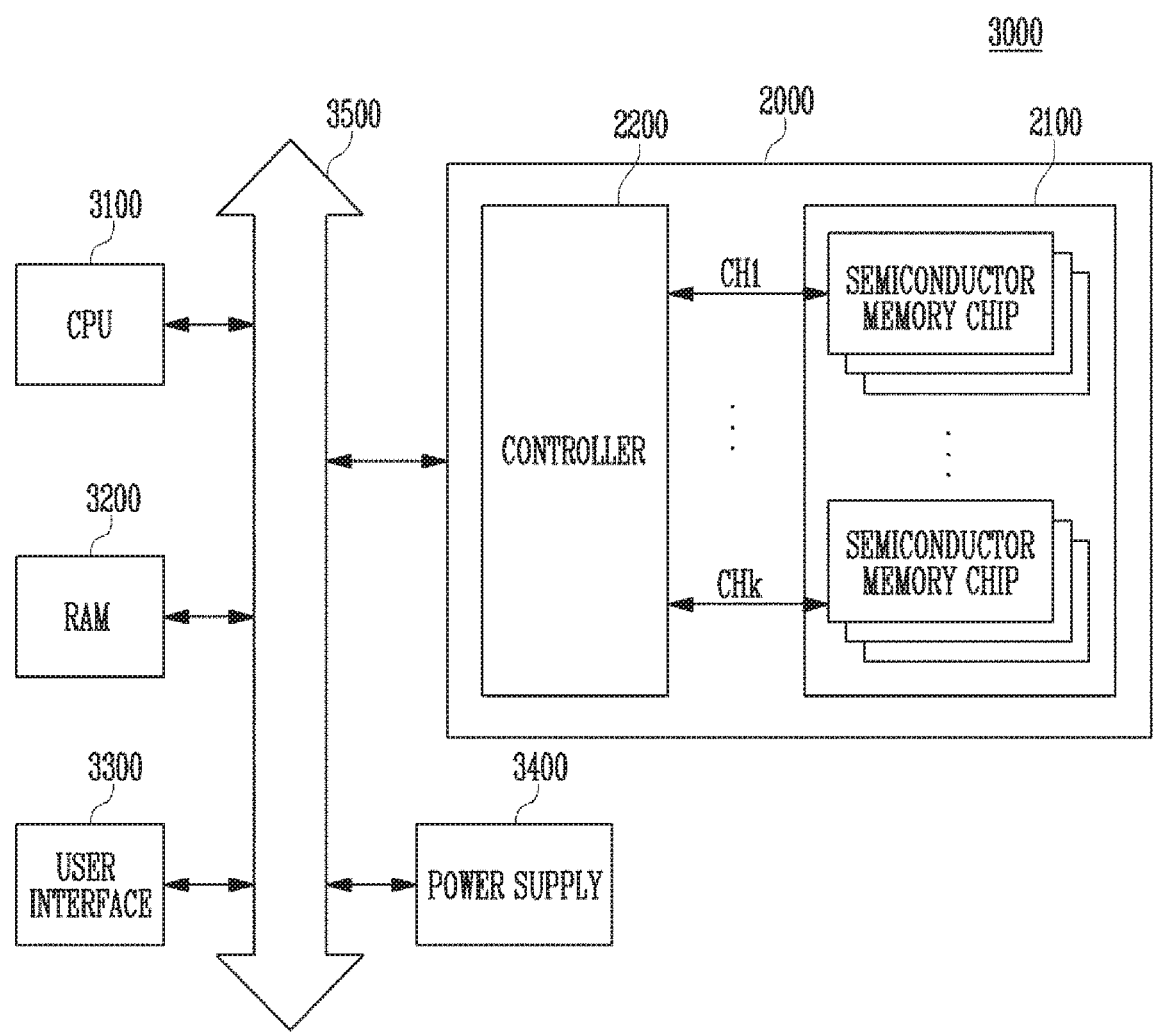
FIG. 24 is a block diagram illustrating a computing system including the memory system described with reference to FIG. 23.

FIG. 24 is a block diagram illustrating a computing system 3000 including the memory system 2000 described in relation to FIG. 23.

Referring to FIG. 24, the computing system 3000 may include a central processing unit 3100, a RAM 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 24, the semiconductor memory device 2100 has been illustrated as being coupled to the system bus 3500 through the controller 2200. Furthermore, the semiconductor memory device 2100 may be directly coupled to the system bus 3500. The function of the controller 2200 may be performed by the CPU 3100 and the RAM 3200.

In FIG. 24, it is illustrated that the memory system 2000 described with reference to FIG. 23 is provided. However, the memory system 2000 may be replaced with the memory system 1000 described with reference to FIG. 22. In an embodiment, the computing system 3000 may include both the memory systems 1000 and 2000 described with reference to FIGS. 22 and 23.

Various embodiments of the present disclosure may provide a semiconductor memory device capable of enhancing the degree of data integration.

Various embodiments of the present disclosure may provide a method capable of operating a semiconductor memory device capable of enhancing the degree of data integration.

Examples of embodiments have been disclosed herein, and although specific terms are employed, the terms are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
a memory cell array including a plurality of memory cells;
a peripheral circuit configured to program shared page data on selected memory cells among the plurality of memory cells; and
a control logic configured to control, during a program operation on the selected memory cells, the peripheral circuit to program first partial data of the shared page data to memory cells coupled to a first word line among the selected memory cells, and to program second partial data of the shared page data to memory cells coupled to a second word line different from the first word line among the selected memory cells,
wherein the control logic controls the peripheral circuit to generate a first bit-state mapping relation for first page data and the shared page data; to generate a second bit-state mapping relation by combining states included in a first group among states included in the first bit-state mapping relation with each other; and to program the first page data and the first partial data based on the second bit-state mapping relation,
wherein the first bit-state mapping relation includes states of eight levels, the first group includes a first state, a second state, a third state, and a fourth state, and
wherein the second bit-state mapping relation is generated by combining the first and the second states with each other and combining the third and the fourth states with each other.

2. The semiconductor memory device according to claim 1, wherein the control logic controls the peripheral circuit to generate the first bit-state mapping relation for second page data and the shared page data; to generate a third bit-state mapping relation by combining states included in a second group among the states included in the first bit-state mapping relation with each other; and to program the second page data and the second partial data based on the third bit-state mapping relation,
wherein the second group includes a fifth state, a sixth state, a seventh state, and an eighth state, and
wherein the third bit-state mapping relation is generated by combining the fifth and the sixth states with each other and combining the seventh and the eighth states with each other.

3. The semiconductor memory device according to claim 2,
wherein the first page data includes first most significant bit (MSB) page data and first central significant bit (CSB) page data,
wherein the second page data includes second MSB page data and second CSB page data,
wherein the shared page data is least significant bit (LSB) page data, and
wherein each of the memory cells coupled to the first word line and a corresponding one of the memory cells coupled to the second word line store a total of five bits together.

4. A semiconductor memory device comprising:
a memory cell array including a plurality of memory cells;
a peripheral circuit configured to program shared page data on selected memory cells among the plurality of memory cells; and
a control logic configured to control, during a program operation on the selected memory cells, the peripheral circuit to program first partial data of the shared page data to memory cells coupled to a first word line among the selected memory cells, and to program second partial data of the shared page data to memory cells coupled to a second word line different from the first word line among the selected memory cells,
wherein the control logic controls the peripheral circuit to generate a first bit-state mapping relation for first page data and the shared page data; to generate a second bit-state mapping relation by combining states included in a first group among states included in the first bit-state mapping relation with each other; and to program the first page data and the first partial data based on the second bit-state mapping relation, and
wherein the first bit-state mapping relation includes states of sixteen levels, the first group includes first to eighth states wherein the second bit state mapping relation is generated by combining the first and the second states of the first bit state mapping relation with each other, combining the third and the fourth states with each other, combining the fifth and the sixth states with each other, and combining the seventh and the eighth states with each other.

5. The semiconductor memory device according to claim 4,
wherein the control logic controls the peripheral circuit to generate the first bit-state mapping relation for second page data and the shared page data; to generate a third bit-state mapping relation by combining states included in a second group among the states included in the first bit-state mapping relation with each other; and to program the second page data and the second partial data based on the third bit-state mapping relation,
wherein the second group includes ninth to sixteenth states,
wherein the third bit-state mapping relation is generated by combining the ninth and the tenth states of the first bit-state mapping relation with each other, combining the eleventh and the twelfth states with each other, combining the thirteenth and the fourteenth states with each other, and combining the fifteenth and the sixteenth states with each other,
wherein the first page data includes first most significant bit (MSB) page data, first higher-central significant bit (HCSB) page data, and first lower-central significant bit (LCSB) page data,
wherein the second page data includes second MSB page data, second HCSB page data, and second LCSB page data,
wherein the shared page data is least significant bit (LSB) page data, and
wherein each of the memory cells coupled to the first word line and a corresponding one of the memory cells coupled to the second word line store a total of seven bits together.

6. A method of operating a semiconductor memory device for programming selected memory cells of a plurality of memory cells, the method comprising:
programming first partial data of shared page data, and first page data to memory cells coupled to a first word line among the selected memory cells; and
programming second partial data of the shared page data, and second page data to memory cells coupled to a second word line different from the first word line among the selected memory cells,
wherein the programming of the first partial data and the first page data comprises:
generating a first bit-state mapping relation for the first page data and the shared page data;
generating a second bit-state mapping relation by combining states included in a first group among states included in the first bit-state mapping relation with each other; and
programming the first page data and the first partial data to the memory cells coupled to the first word line, based on the second bit-state mapping relation,
wherein the first bit-state mapping relation for the first page data and the shared page data includes states of eight levels,
wherein the first group includes a first state, a second state, a third state, and a fourth state, and a second group includes a fifth state, a sixth state, a seventh state, and an eighth state, and
wherein the generating of the second bit-state mapping relation comprises generating the second bit-state mapping relation by combining the first and the second states with each other and combining the third and the fourth states with each other.

7. The method according to claim 6, wherein the programming of the second partial data and the second page data comprises:
generating the first bit-state mapping relation for the second page data and the shared page data;
generating a third bit-state mapping relation by combining states included in the second group among the states included in the first bit-state mapping relation with each other; and
programming the second page data and the second partial data to the memory cells coupled to the second word line, based on the third bit-state mapping relation,
wherein the generating of the third bit-state mapping relation comprises generating the third bit-state mapping relation by combining the fifth and the sixth states with each other and combining the seventh and the eighth states with each other.

8. The method according to claim 7,
wherein the first page data includes first most significant bit (MSB) page data and first central significant bit (CSB) page data,
wherein the second page data includes second MSB page data and second CSB page data,
wherein the shared page data is least significant bit (LSB) page data, and
wherein each of the memory cells coupled to the first word line and a corresponding one of the memory cells coupled to the second word line store a total of five bits together.

9. A method of operating a semiconductor memory device for programming selected memory cells of a plurality of memory cells, the method comprising:
programming first partial data of shared page data, and first page data to memory cells coupled to a first word line among the selected memory cells; and
programming second partial data of the shared page data, and second page data to memory cells coupled to a second word line different from the first word line among the selected memory cells,
wherein the programming of the first partial data and the first page data comprises:
generating a first bit-state mapping relation for the first page data and the shared page data;
generating a second bit-state mapping relation by combining states included in a first group among states included in the first bit-state mapping relation with each other; and
programming the first page data and the first partial data to the memory cells coupled to the first word line, based on the second bit-state mapping relation,
wherein the first bit-state mapping relation for the first page data and the shared page data includes states of sixteen levels,
wherein the first group includes first to eighth states, and a second group includes ninth to sixteenth states,
wherein the generating of the second bit-state mapping relation comprises generating the second bit-state mapping relation by combining the first and the second states of the first bit-state mapping relation with each other, combining the third and the fourth states with each other, combining the fifth and the sixth states with each other, and combining the seventh and the eighth states with each other, and
wherein the generating of a third bit-state mapping relation comprises generating the third bit-state mapping relation by combining the ninth and the tenth states of the first bit-state mapping relation with each other, combining the eleventh and the twelfth states with each other, combining the thirteenth and the fourteenth states with each other, and combining the fifteenth and the sixteenth states with each other.

10. The method according to claim 9,
wherein the first page data includes first most significant bit (MSB) page data, first higher-central significant bit (HCSB) page data, and first lower-central significant bit (LCSB) page data,
wherein the second page data includes second MSB page data, second HCSB page data, and second LCSB page data,
wherein the shared page data is least significant bit (LSB) page data, and
wherein each of the memory cells coupled to the first word line and a corresponding one of the memory cells coupled to the second word line store a total of seven bits together.

\* \* \* \* \*